US012796114B2

(12) United States Patent
Chiang et al.

(10) Patent No.: US 12,796,114 B2
(45) Date of Patent: Nov. 10, 2026

(54) PHOTODETECTORS HAVING STACKED CONTACT AND SENSING REGIONS

(71) Applicant: Taiwan Semiconductor Manufacturing Company, Ltd., Hsinchu (TW)

(72) Inventors: Chen-Hao Chiang, Jhongli City (TW); Chih-Ming Chen, Hsinchu City (TW); Jing-Hwang Yang, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 848 days.

(21) Appl. No.: 17/663,106

(22) Filed: May 12, 2022

(65) Prior Publication Data

US 2023/0369526 A1 Nov. 16, 2023

(51) Int. Cl.
*H10F 30/221* (2025.01)
*H10F 71/00* (2025.01)
*H10F 77/1226* (2025.01)

(52) U.S. Cl.
CPC ..... *H10F 30/2218* (2025.01); *H10F 71/1215* (2025.01); *H10F 77/1227* (2025.01)

(58) Field of Classification Search
CPC ............. H10F 30/2218; H10F 71/1215; H10F 71/1212
See application file for complete search history.

(56) References Cited

U.S. PATENT DOCUMENTS

| | | | | |
|---|---|---|---|---|
| 2004/0245937 | A1* | 12/2004 | Hayashi | H10H 20/813 315/169.3 |
| 2011/0037097 | A1* | 2/2011 | Scott | H10F 71/1272 257/E31.003 |
| 2014/0175513 | A1* | 6/2014 | Yao | H10D 64/01314 257/192 |
| 2016/0018478 | A1* | 1/2016 | Hebert | G01R 33/0052 257/421 |
| 2017/0040362 | A1* | 2/2017 | Na | H10F 71/139 |
| 2017/0117309 | A1* | 4/2017 | Chen | H10F 39/014 |
| 2018/0033812 | A1* | 2/2018 | Hsu | H10F 39/807 |
| 2021/0066079 | A1* | 3/2021 | Barbosa Lima | H10P 14/3411 |
| 2023/0292573 | A1* | 9/2023 | Lee | H10K 59/121 |

FOREIGN PATENT DOCUMENTS

CN 102830859 A * 12/2012

* cited by examiner

*Primary Examiner* — William B Partridge
*Assistant Examiner* — Felix B Andrews
(74) *Attorney, Agent, or Firm* — Harrity & Harrity, LLP

(57) ABSTRACT

A stacked (or vertically arranged) photodetector having at least one contact region on a germanium sensing region. Including the at least one contact on the germanium sensing region reduces the amount of surface area of the germanium sensing region that is interfaced with a substrate (e.g., a silicon substrate) in which the germanium sensing region is included. This reduces the amount of lattice mismatch reduces the amount of misfit defects for the germanium sensing region, which reduces the dark current for the photodetector. The reduced amount of dark current may increase the photosensitivity of the photodetector, may increase low-light performance of the photodetector, and/or may decrease noise and other defects in images and/or light captured by the photodetector, among other examples.

19 Claims, 28 Drawing Sheets

PHOTODETECTORS HAVING STACKED CONTACT AND SENSING REGIONS

BACKGROUND

A photodetector is a semiconductor device that is configured to receive photons of incident light and convert the photons to an electrical signal. The electrical signal may include a current (referred to as a photocurrent) and/or a voltage, among other examples. The photons generate electron/hole pairs in a light absorption material of the photodetector. The electrons and holes are separated and collected at opposing contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
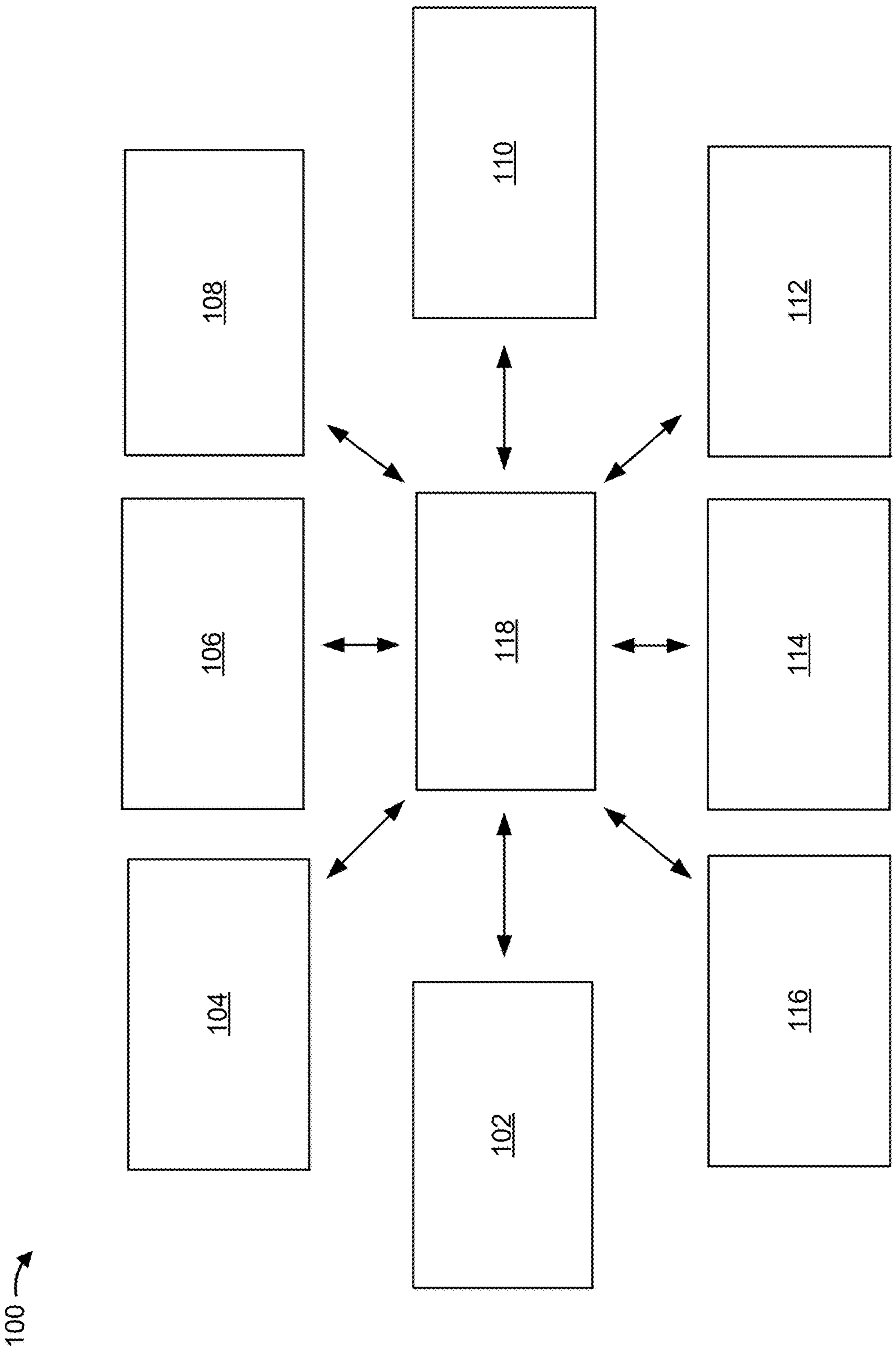
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photodetectors have many use cases, including light detection, ranging (e.g., lidar), optical communications, and cameras, among other examples. Some photodetectors include germanium as a light absorption material. Germanium (Ge) may provide faster carrier collection and increased bandwidth relative to other types of light absorption materials. However, germanium that is epitaxially grown on another material such as silicon (Si) may suffer from defects due to a lattice mismatch between the germanium and the other material. These defects may include dislocation defects that occur in bulk germanium material and misfit defects that occur at interfaces between the germanium material and the other material.

The defects due to lattice mismatch of epitaxially grown germanium may decrease the performance of a photodetector that includes a germanium light absorption material in that these defects may increase dark current of the photodetector. Dark current is an electrical current that may occur in a photodetector as a result of current leakage in the photodetector. Dark current may result from, for example, current leakage that occurs in the bulk material of the germanium light absorption material (e.g., due to dislocation defects) and current leakage that occurs at interfaces between the germanium light absorption material and another material (e.g., due to misfit defects). Dark current can cause noise and other defects in images and/or light captured by the photodetector, can cause decreased photosensitivity of the photodetector, and/or can decrease low-light performance of the photodetector, among other examples.

Some implementations described herein provide photodetectors and methods of formation. In some implementations, a photodetector described herein includes a stacked (or vertically arranged) photodetector having at least one contact region on a germanium sensing region as opposed to the at least one contact being adjacent to the germanium sensing region. Including the at least one contact on the germanium sensing region reduces the amount of surface area of the germanium sensing region that is interfaced with a substrate (e.g., a silicon substrate) in which the germanium sensing region is included. This reduces the amount of lattice mismatch and reduces the amount of misfit defects for the germanium sensing region, which reduces the dark current for the photodetector. The reduced amount of dark current may increase the photosensitivity of the photodetector, may increase low-light performance of the photodetector, and/or may decrease noise and other defects in images and/or light captured by the photodetector, among other examples.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, an annealing tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a sensing region included in a substrate of a photodetector device; may form a first contact region adjacent to the sensing region; and/or may form a second contact region on the sensing region, among other examples. The photodetector device may include a capping layer on the second contact region. The photodetector device may include a remote plasma oxide layer on the capping layer. The first contact region may include an n-type contact region and the second contact region may include a p-type contact region. The sensing region may include a germanium sensing region and the second contact region may include a p-doped germanium contact region. The photodetector device may include a p-doped capping layer on the p-doped germanium contact region. The p-doped capping layer may include a p-doped silicon capping layer.

As another example, one or more of the semiconductor processing tools 102-116 and/or the wafer/die transport tool 118 may form, in a substrate, an n-doped contact region of a photodetector device; may form, in the substrate, a recess adjacent to the n-doped contact region; may form, in the recess, a germanium sensing region of the photodetector device; may form a p-doped germanium contact region of the photodetector device on the germanium sensing region; and/or may form a p-doped capping layer on the p-doped germanium contact region, among other examples.

As another example, one or more of the semiconductor processing tools 102-116 and/or the wafer/die transport tool 118 may form an oxide layer on a substrate of a photodetector device; may form a germanium sensing region included in the substrate; may form an n-type contact region in the substrate and adjacent to the germanium sensing region; may form a shallow trench isolation (STI) region in the substrate between the n-type contact region and the germanium sensing region; and/or may form a p-type contact region on the sensing region, where a bottom surface of the p-type contact region is below a top surface of the oxide layer, and where a top surface of the p-type contact region is above the top surface of the oxide layer, among other examples. The photodetector device may include a p-type capping layer on the top surface of the p-type contact region and on a portion of one or more sides of the p-type contact region. The photodetector device may include a remote plasma oxide layer on the top surface of the p-type capping layer and on at least a portion of one or more sides of the p-type capping layer. The remote plasma oxide layer is included above and over the p-type contact region. The photodetector device of claim may include an n-type extension region in the substrate and below the n-type contact region, where a portion of the n-type extension region is below the p-type contact region. A top surface of the germanium sensing region is approximately flat, and the top surface of the germanium sensing region is lower relative to the top surface of the oxide layer.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
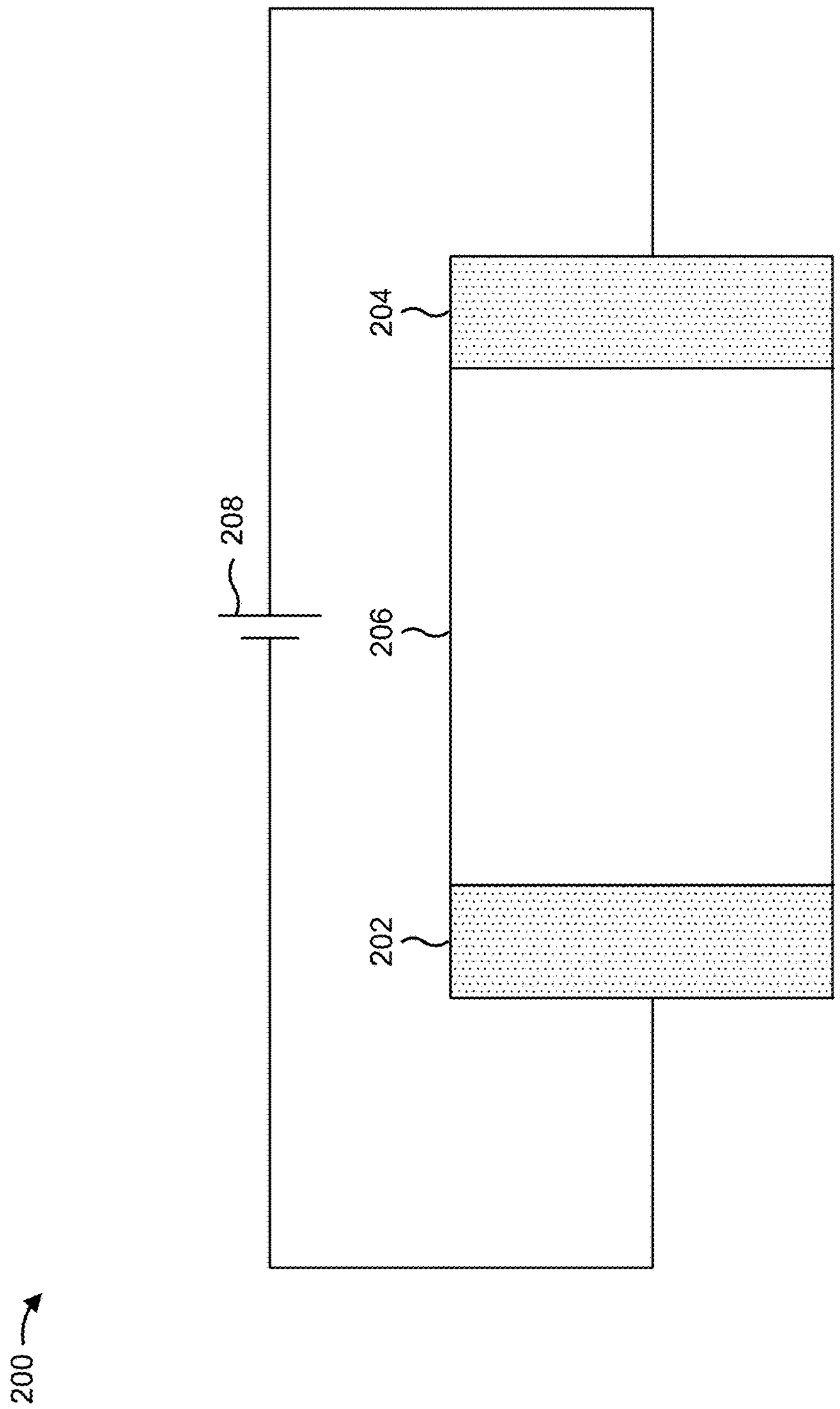
FIGS. 2, 3, 4A, 4B, 5, and 6A-6C are diagrams of examples of a photodetector device described herein.

FIG. 2 is a diagram of an example of a photodetector device 200 described herein. In particular, FIG. 2 is a circuit schematic diagram of the photodetector device 200. The photodetector device 200 includes a semiconductor device that is configured to generate a current, a voltage, and/or another type of output based on absorbed photons of light. The photodetector device 200 may be a standalone device or may be included in another device such as a camera, an image sensor, or an Internet of things (IoT) device, among other examples.

As shown in FIG. 2, the photodetector device 200 may include a contact region 202 and a contact region 204. A sensing region 206 of the photodetector device 200 may be included between the contact region 202 and the contact region 204. The contact region 202 and the contact region 204 are electrically coupled to an output 208 of the photodetector device 200.

As indicated above, FIG. 2 is provided as an example. Other examples may differ from what is described with regard to FIG. 2.

Figure 3:
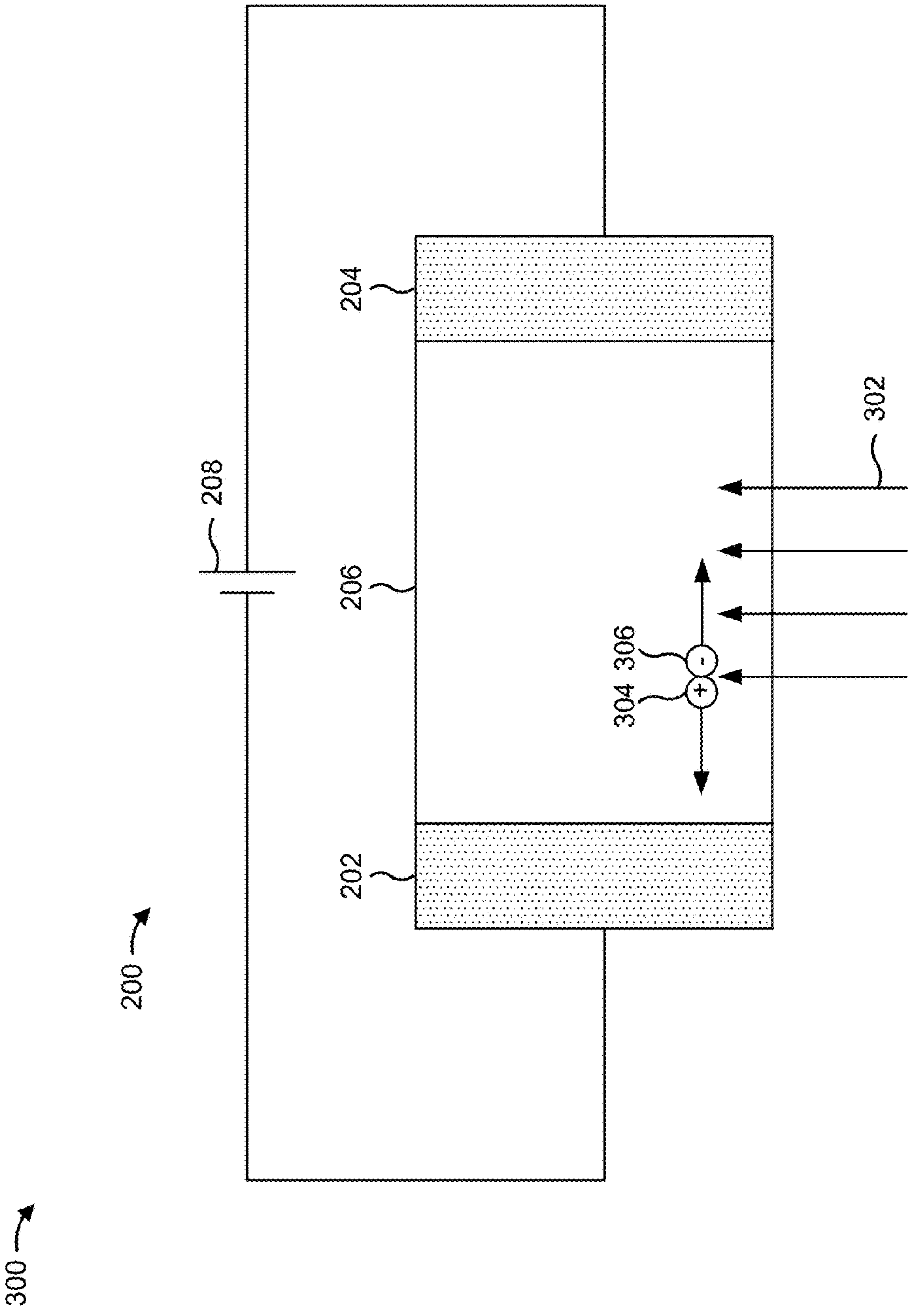

FIG. 3 is a diagram of an example 300 of a photodetector device 200 described herein. In particular, FIG. 3 is a circuit schematic diagram illustrating the operation of the photodetector device 200.

As shown in FIG. 3, the sensing region 206 of the photodetector device 200 is configured to receive photons of incident light 302. The photons interact with electron-hole pairs in the material of the sensing region 206. The interaction causes holes 304 and electrons 306 to be separated and to migrate toward opposing sides of the sensing region 206. The contact region 202 and the contact region 204 may be doped with different types of dopants to promote the flow of electrons 306 toward the contact region 202 and holes 304 toward the contact region 204. The electrons 306 are collected at the contact region 204, and the holes 304 are collected at the contact region 202. For example, the contact region 202 may be doped with one or more p-type dopants and/or may include one or more p-type materials to promote the flow of holes 304 toward the contact region 202. As another example, the contact region 204 may be doped with one or more n-type dopants and/or may include one or more n-type materials to promote the flow of electrons 306 toward the contact region 204.

The accumulation of holes 304 at the contact region 202 and the accumulation of electrons 306 at the contact region 204 causes a current to be generated at the output 208 of the photodetector device 200. The magnitude of the current may be proportional to the amount of photons that is collected in the sensing region 206. Accordingly, the current that is generated at the output 208 may be an indication of the intensity of the incident light 302.

As indicated above, FIG. 3 is provided as an example. Other examples may differ from what is described with regard to FIG. 3.

Figure 4A:
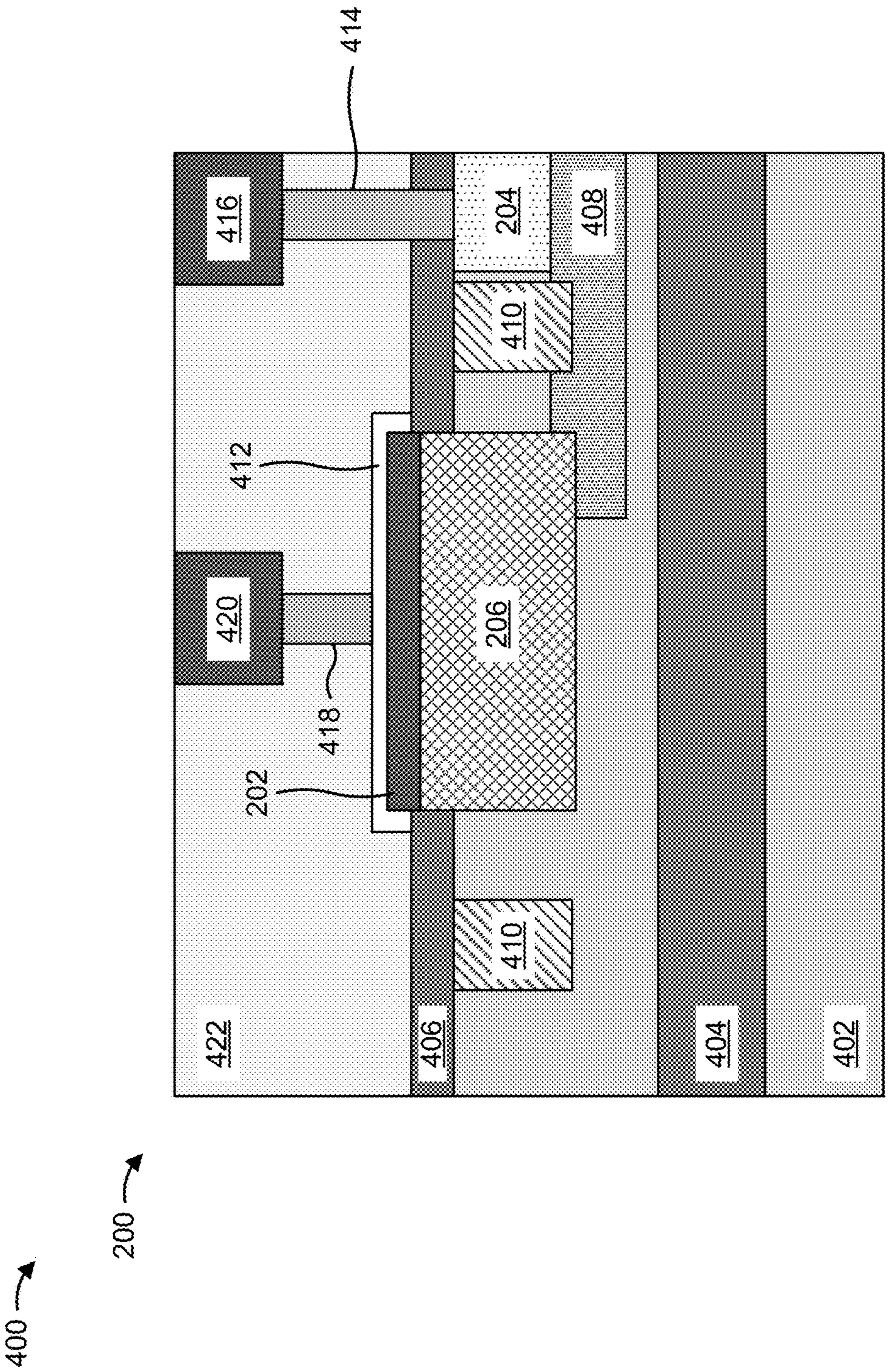
Figure 4B:
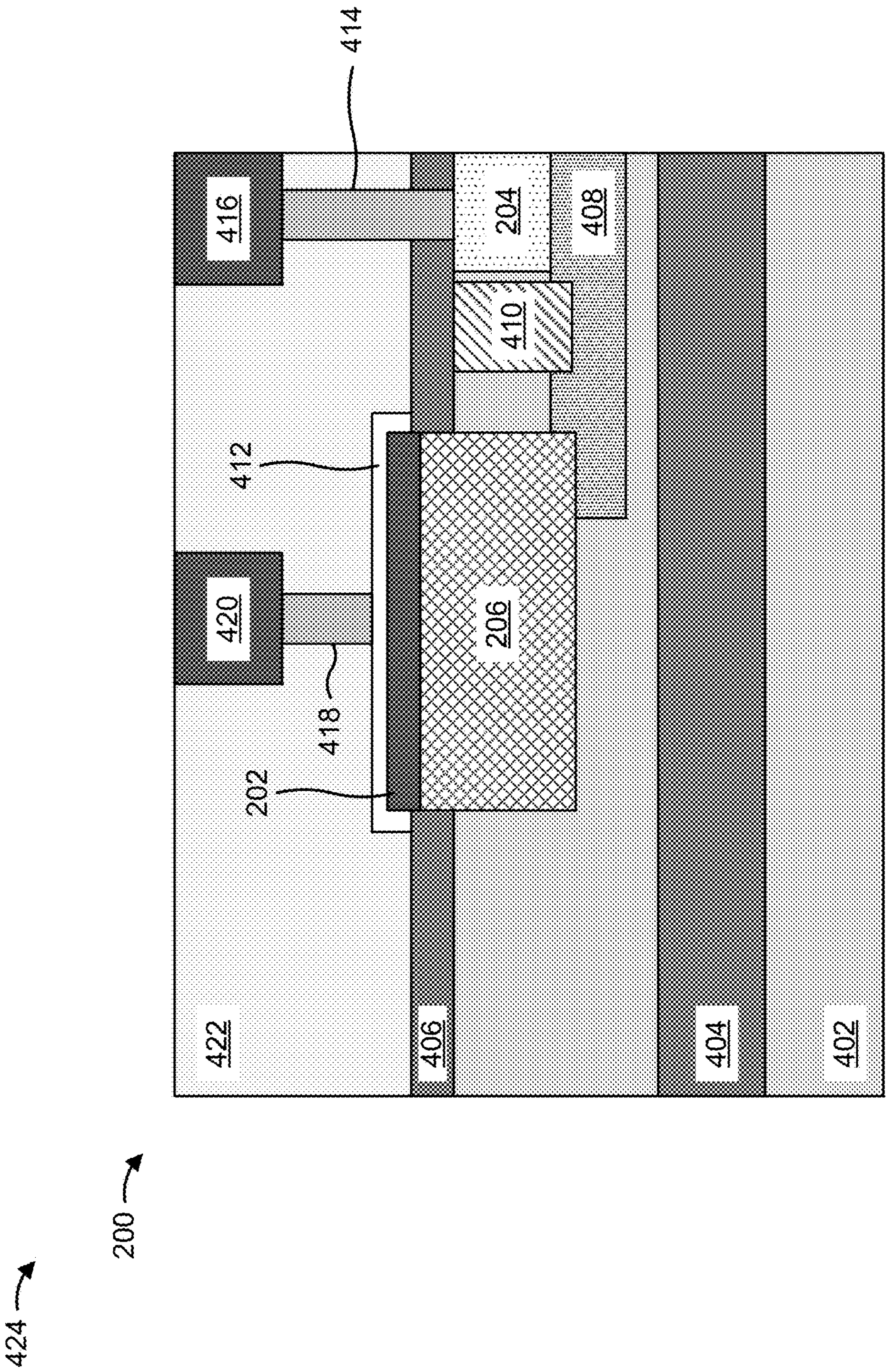

FIGS. 4A and 4B are diagrams of examples of a photodetector device 200 described herein. In particular, FIGS. 4A and 4B are cross-sectional views illustrating example structural configurations for the semiconductor structure of the photodetector device 200.

FIG. 4A illustrates an example 400 of a photodetector device 200. As shown in FIG. 4A, the photodetector device 200 includes a substrate 402. The substrate 402 may include a semiconductor die substrate, a semiconductor wafer, a stacked semiconductor wafer, or another type of substrate in which semiconductor pixels may be formed. In some implementations, the substrate 402 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 402 is formed of a doped material (e.g., a p-doped material or an n-doped material) such as a doped silicon.

As shown in FIG. 4A, the photodetector device 200 includes the sensing region 206 in the substrate 402 and the contact region 204 in the substrate adjacent to the sensing region 206. The contact region 204 may include an n-type contact region or an n-doped contact region. The contact region 204 may include a portion or region of the substrate 402 that is doped with one or more n-type dopants such as phosphorous (P) or arsenic (As), among other examples. This promotes the flow of electrons 306 from the sensing region 206 to the contact region 204.

The sensing region 206 may include a germanium (Ge) sensing region. Germanium may provide a higher bandwidth relative to other semiconductor materials such as silicon due to the greater electron mobility relative to silicon and greater hole mobility in germanium relative to silicon. The greater electron mobility and greater hole mobility provides faster carrier collection at the contact region 202 and the contact region 204, which increases the speed of operation of the photodetector device 200. However, the sensing region 206 may include another type of photosensitive material.

The lattice size of the sensing region 206 may be larger or greater than the lattice size of the substrate 402. For example, the lattice constant may be approximately 5.43095 angstroms for the silicon in the substrate 402, whereas the lattice constant may be approximately 5.6579 angstroms for the germanium in the sensing region 206. This may result in a lattice mismatch of approximately 4.2% between the substrate 402 and the sensing region 206. Moreover, the lattice thermal expansion of the sensing region 206 may be larger or greater than the lattice thermal expansion of the substrate 402. For example, the lattice thermal expansion may be approximately $2.6\times10^{-6}$/K for the silicon in the substrate 402, whereas the lattice thermal expansion may be approximately $5.9\times10^{-6}$/K for the germanium in the sensing region 206.

As further shown in FIG. 4A, the photodetector device 200 includes the contact region 202 on the sensing region 206. In this way, the contact region 202 and the sensing region 206 are stacked or vertically arranged. Thus, the photodetector device 200 may be referred to as a stacked photodetector. The contact region 202 and the sensing region 206 may include the same bulk material such as germanium (Ge). However, the contact region 202 may include one or more p-type dopants such that the contact region 202 is a p-type contact region or a p-doped contact region. This promotes the flow of holes 304 from the sensing region 206 toward the contact region 202. The one or more p-type dopants may include boron (B), indium (In), and/or another p-type dopant. Thus, the contact region 202 may include boron-doped germanium, indium-doped germanium, and/or germanium doped with another p-type dopant.

Including the contact region 202 on the sensing region 206 reduces the amount of surface area of the sensing region 206 that is interfaced with the substrate 402. Moreover, the contact region 202 and the sensing region 206 both being formed of germanium reduces the amount of surface area of the sensing region 206 that is interfaced with silicon of the substrate 402. This reduces the amount of surface area of the sensing region 206 that experiences a lattice mismatch (e.g., due to the difference in lattice size of the germanium of the sensing region 206 and the lattice size of the silicon of the substrate 402).

The reduced amount of lattice mismatch provides reduced misfit defect formation in the sensing region 206, which reduces the dark current level of the photodetector device 200. For example, including the contact region 202 on the sensing region 206 may reduce the dark current of the photodetector device 200 by approximately 30% to approximately 40% or more. The dark current of the photodetector device 200 may be determined as:

$$I_{Dark} = I_{Ge\ Bulk} + I_{Ge/Si}$$

where $I_{Dark}$ represents the dark current of the photodetector device 200, $I_{Ge\ Bulk}$ represents the bulk leakage current due to dislocation in the sensing region 206, and $I_{Ge/Si}$ represents the surface leakage current due to misfit defects along the interface between the sensing region 206 and the substrate 402. Including the contact region 202 on the sensing region 206 may reduce the surface leakage current (e.g., the $I_{Ge/Si}$) in that including the contact region 202 on the sensing region 206 results in less interface surface area between the sensing region 206 and the substrate 402.

A buried oxide (BOX) 404 may be included in the substrate 402. The buried oxide 404 includes an oxide material such as a silicon oxide ($SiO_x$) or another oxide material. The buried oxide 404 may be included for confinement of holes 304 and electrons 306 in the photodetector device 200. In other words, the buried oxide 404 resists holes 304 and electrons 306 from traversing further downward into the substrate 402 from the sensing region 206 to increase the operational efficiency of the photodetector device 200. A top oxide 406 may be included over and/or on the substrate 402, which may also include an oxide material such as a silicon oxide ($SiO_x$) or another oxide material.

As further shown in FIG. 4A, a top surface of the sensing region 206 may be located at a greater height in the photodetector device 200 relative to a bottom surface of the top oxide 406, and may be located at a lesser height in the photodetector device 200 relative to a top surface of the top oxide 406. The top surface of the sensing region 206 may be located at a greater height in the photodetector device 200 relative to a top surface of the substrate 402. The top surface of the sensing region 206 may be located at a greater height in the photodetector device 200 relative to a top surface of the contact region 204.

A bottom surface of the contact region 202 may be located a lesser height in the photodetector device 200 relative to the top surface of the top oxide 406. A top surface of the contact region 202 may be located at a greater height in the photodetector device 200 relative to the top surface of the top oxide 406. The contact region 202 may be located above the substrate 402 and at a greater height in the photodetector device 200 relative to the contact region 204.

As further shown in FIG. 4A, an extension region 408 may be included in the substrate 402 and may extend at least partially between the sensing region 206 and the contact 204. In some implementations, the extension region 408 is included at least partially under the contact region 204 and at least partially under the sensing region 206. The extension region 408 may be configured to facilitate and/or promote the flow of electrons 306 from the sensing region 206 to the contact region 204. The extension region 408 may include a lightly doped region of the substrate 402 that is doped with one or more n-type dopants. The n-type dopant concentration in the extension region 408 may be lesser than the n-type dopant concentration in the contact region 204. The lesser concentration of n-type dopants in the extension region 408 promotes a one-way flow of electrons 306 (e.g., such that the electrons 306 flow from the sensing region 206 to the contact region 204, but not from the contact region 204 to the extension region 408).

As further shown in FIG. 4A, the photodetector device 200 includes one or more STI regions 410 in the substrate 402. An STI region 410 may be included between the sensing region 206 and the contact region 204, and may be included above a portion of the extension region 408. In some implementations, STI regions 410 are included to surround the sensing region 206.

An STI region 410 may include one or more trenches that extend downward into the substrate 402. The STI region(s) 410 may provide optical isolation for the photodetector device 200. In particular, the STI region(s) 410 may absorb, refract, and/or reflect photons of incident light, which may reduce the amount of incident light that travels through the photodetector device 200 into an adjacent photodetector device and/or into another type of adjacent device.

The STI region(s) 410 may include an oxide layer. The oxide layer may include an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer.

As further shown in FIG. 4A, a capping layer 412 may be included over and/or on the contact region 202. The capping layer 412 may also be included on at least a portion of one or more sides of the contact region 202, and on a portion of the top oxide 406. The capping layer 412 may be included to protect the contact region 202 from oxidation, dopant diffusion, and/or damage during processing of the photodetector device 200. The capping layer 412 may include silicon, a doped silicon, and/or another material. In some implementations, the capping layer 412 includes a p-doped silicon layer or a p-type silicon layer. The silicon of the capping layer 412 may be doped with one or more p-type dopants such as boron (B), indium (In), and/or another p-type dopant.

The contact region 202 and the contact region 204 may each be electrically coupled to the output 208 of the photodetector device 200 by one or more types of conductive structures. For example, the contact region 204 may be electrically coupled to the output 208 by a contact 414 and a metallization layer 416, among other examples. As another example, the contact region 202 may be electrically coupled to the output 208 by a contact 418 and a metallization layer 420, among other examples. The contact 418 and the metallization layer 420 may be included above and/or over the sensing region 206 because of the contact region 202 being stacked on the sensing region 206.

The contact 414, the metallization layer 416, the contact 418, and the metallization layer 420 may each include one or more types of conductive materials such as one or more metals and/or one or more metal alloys, among other examples. For example, the contact 414, the metallization layer 416, the contact 418, and the metallization layer 420 may each include copper (Cu), tungsten (W), cobalt (Co), ruthenium (Ru), aluminum (Al), and/or another conductive material.

The contact 414, the metallization layer 416, the contact 418, and the metallization layer 420 may be included in a dielectric layer 422 of the photodetector device 200. The dielectric layer 422 may include an interlayer dielectric (ILD) and/or another type of dielectric layer. The dielectric layer 422 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another type of dielectric material.

FIG. 4B illustrates an alternative example 424. The example 424 is similar to the example 400 and includes similar structures. However, one or more of the STI regions 410 are omitted from one or more sides of the sensing region 206. This is due to the contact region 202 being located over and/or on the sensing region 206 as opposed to being located in the substrate 402 and adjacent to the sensing region 206.

As indicated above, FIGS. 4A and 4B are provided as examples. Other examples may differ from what is described with regard to FIGS. 4A-4B.

Figure 5:
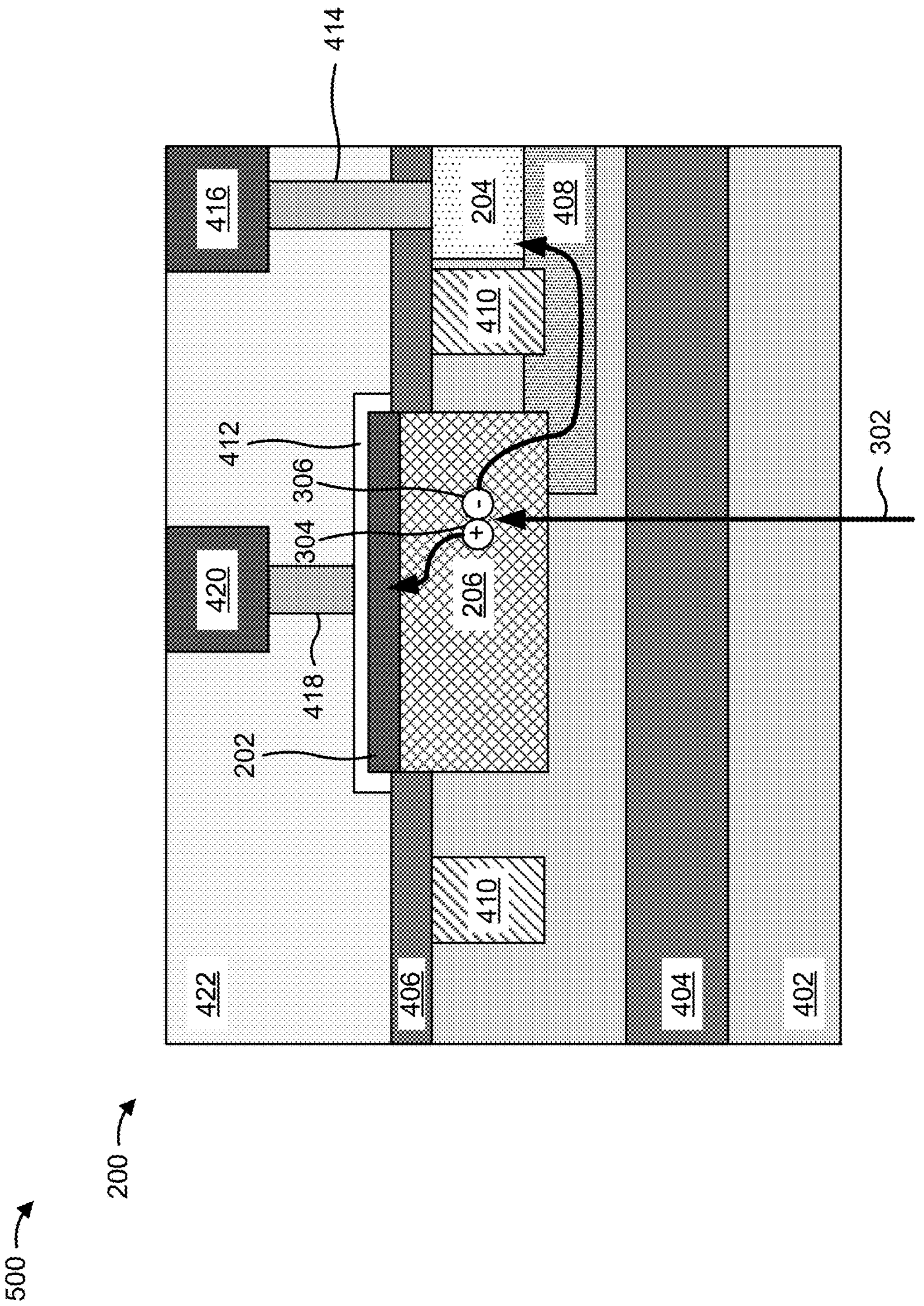

FIG. 5 is a diagram of an example 500 of a photodetector device 200 described herein. In particular, FIG. 5 is a cross-sectional view of the photodetector device 200 illustrating the operation of the photodetector device 200.

As shown in FIG. 5, the sensing region 206 of the photodetector device 200 is configured to receive photons of incident light 302. The photons interact with electron-hole pairs in the material of the sensing region 206. The interaction causes holes 304 and electrons 306 to be separated and to migrate toward different sides of the sensing region 206. The electrons 306 traverse from the sensing region 206 to the contact region 204. In particular, the electrons 306 traverse from the sensing region 206 to the extension region 408, and through the extension region 408 under the STI region 410 between the sensing region 206 and the contact region 204. The electrons 306 traverse from the extension region 408 to the contact region 204.

The holes 304 traverse from the sensing region 206 directly to the contact region 202 because of the contact region 202 being located on the sensing region 206. In other words, the holes 304 traverse from the sensing region 206 to the contact region 202 without traversing through the substrate 402 and/or another structure or layer.

As indicated above, FIG. 5 is provided as an example. Other examples may differ from what is described with regard to FIG. 5.

Figure 6A:
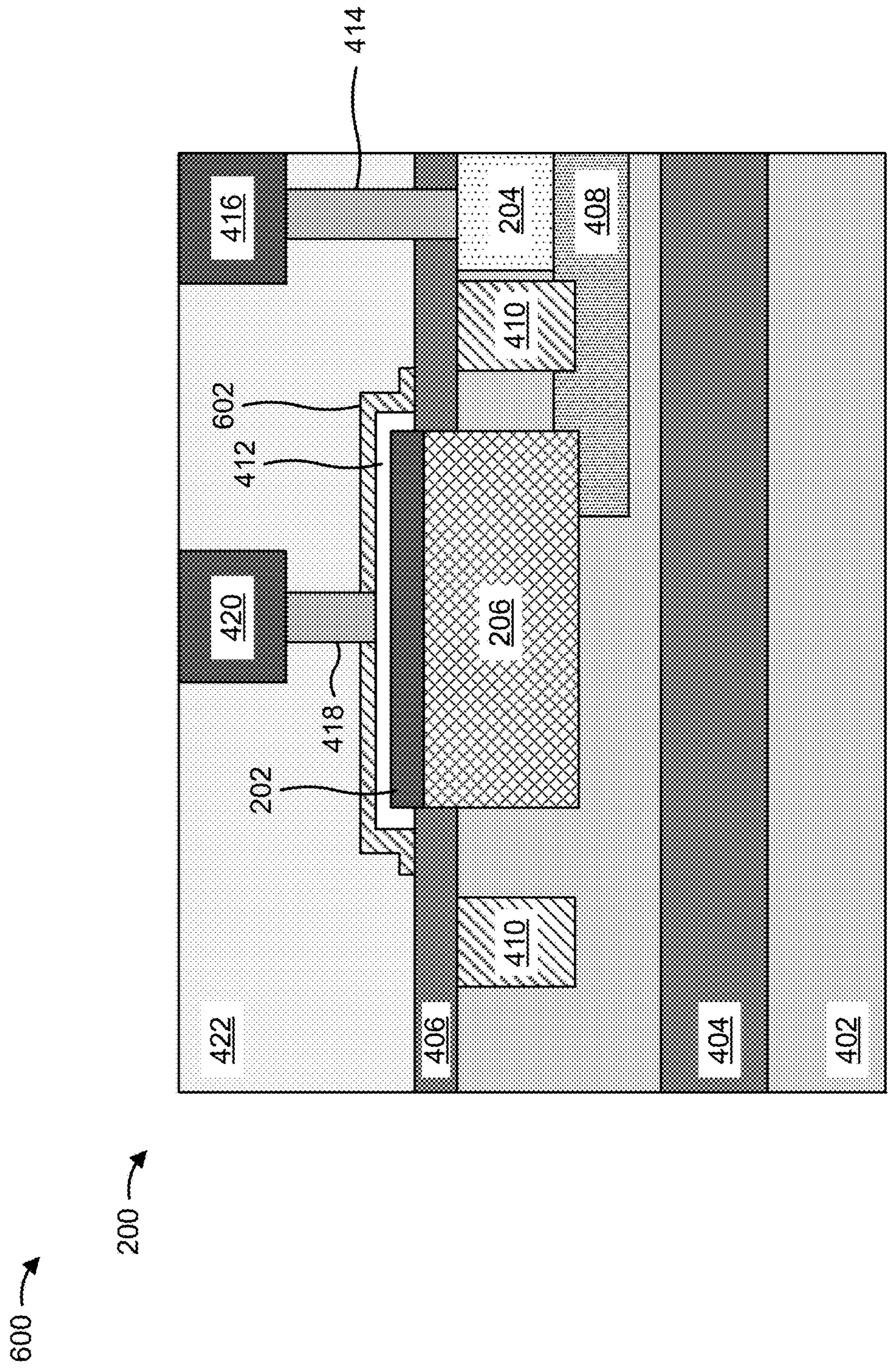
Figure 6B:
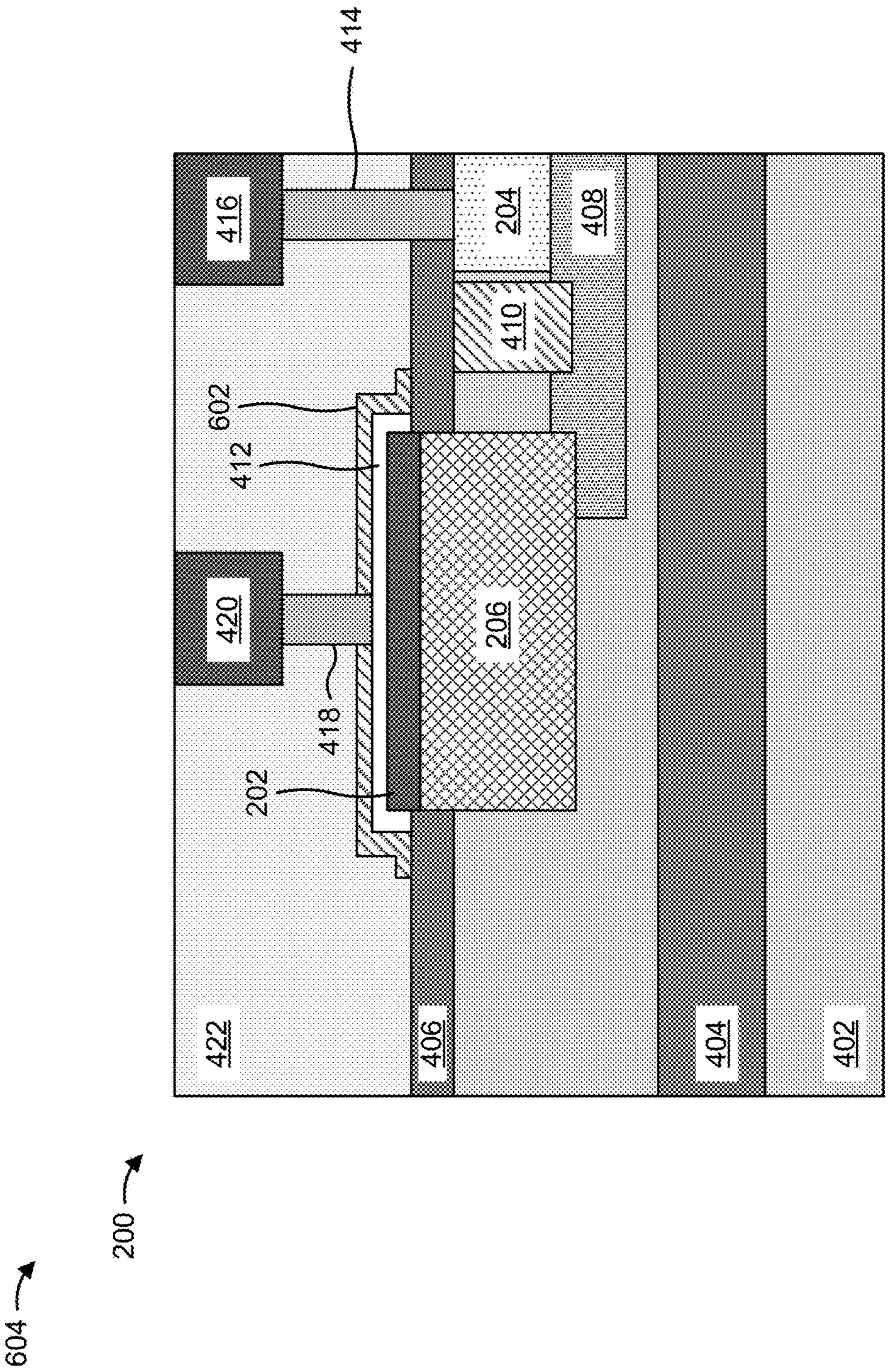
Figure 6C:
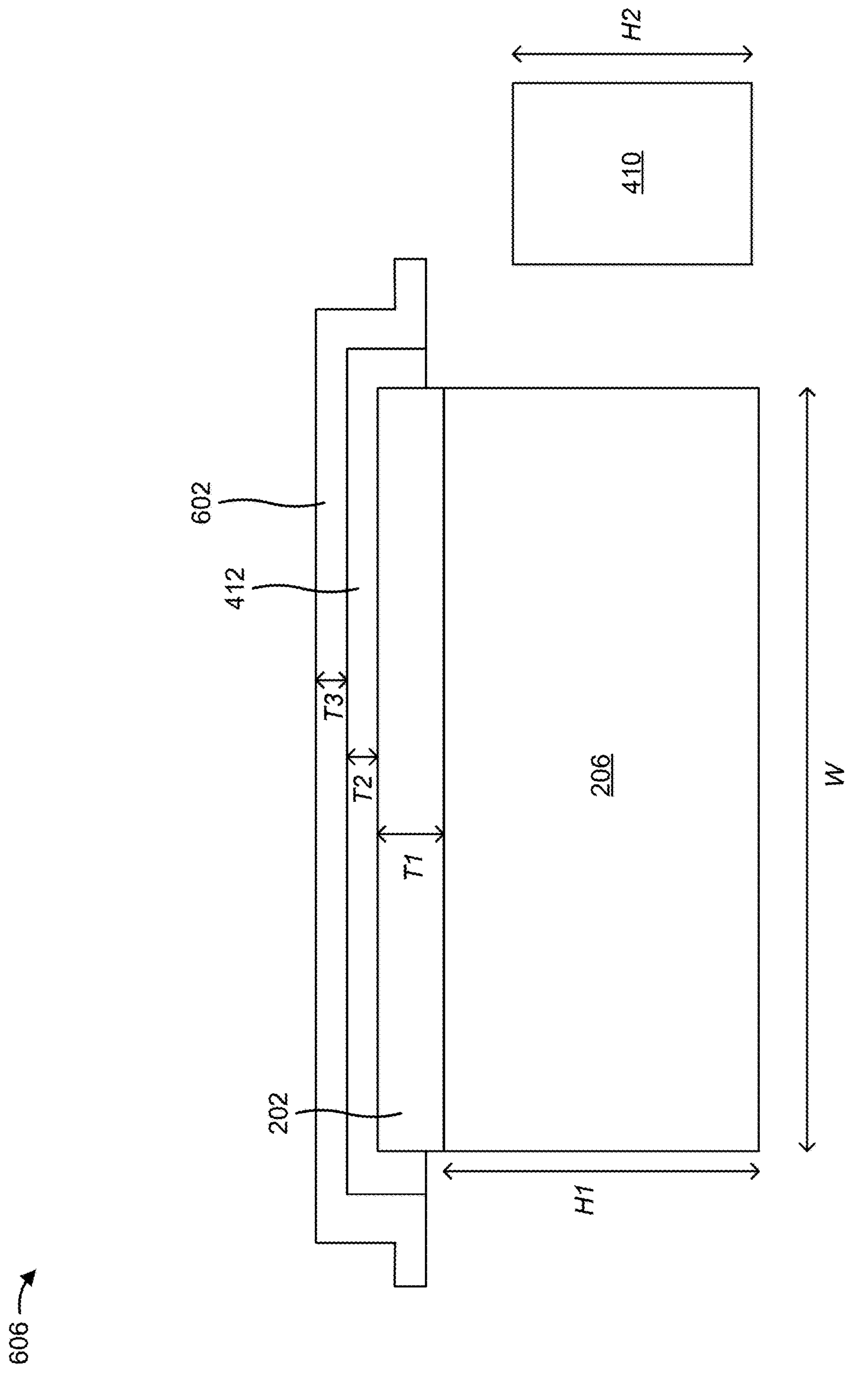

FIGS. 6A-6C are diagrams of examples of a photodetector device 200 described herein. In particular, FIGS. 6A-6C are cross-sectional views illustrating example structural configurations for the semiconductor structure of the photodetector device 200.

FIG. 6A illustrates an example 600 of a photodetector device 200. The example 600 of the photodetector device 200 may be similar to the example 400 of the photodetector device 200. However, in the example 600, the photodetector device 200 includes a remote plasma oxide (RPO) layer 602 over and/or on the capping layer 412. The remote plasma oxide layer 602 may also be included on at least a portion of one or more sides of the capping layer 412 and/or on a portion of the top oxide 406. The remote plasma oxide layer 602 may be included to protect the capping layer 412 from plasma damage during one or more subsequent processing operations for the photodetector device 200. The remote plasma oxide layer 602 may include a silicon oxide ($SiO_x$), a tetraethyl orthosilicate (TEOS), or another type of dielectric material.

FIG. 6B illustrates an alternative example 604. The example 604 is similar to the example 600 and includes similar structures. However, one or more of the STI regions 410 are omitted from one or more sides of the sensing region 206. This is due to the contact region 202 being located over and/or on the sensing region 206 as opposed to being located in the substrate 402 and adjacent to the sensing region 206.

FIG. 6C illustrates an example 606 of one or more dimensions of a photodetector device 200 described herein. One or more of the examples 400, 424, 600, and/or 602 may include the one or more dimensions described in the example 606 in FIG. 6C. As shown in FIG. 6C, a sensing region 206 may include a width (W). In some implementations, the width (W) is included in a range of approximately 0.3 microns to approximately 1.1 microns to achieve a sufficiently low dark current for the photodetector 200 in that dark current may increase if the width is too small (e.g., due to higher electron field) or too large (e.g., due to increased misfit defects due to larger interface surface area). However, other values for the range are within the scope of the present disclosure.

As shown in FIG. 6C, a sensing region 206 may include a height (H1). In some implementations, the height (H1) is included in a range of approximately 200 nanometers to approximately 350 nanometers to achieve a sufficiently low dark current for the photodetector 200 in that dark current may increase if the width is too small (e.g., due to higher electron field) or too large (e.g., due to increased misfit defects due to larger interface surface area). Moreover, the height (H1) of the sensing region 206 may be included in this range to provide sufficient photon absorption performance, as the height (H1) being too small may result in reduced absorption area. However, other values for the range are within the scope of the present disclosure.

In some implementations, an aspect ratio of the width (W) to the height (H1) may be included in a range of approximately 0.85:1 to approximately 5.5:1 to achieve sufficiently low dark current and to achieve sufficient photon absorption. However, other values for the range are within the scope of the present disclosure.

As shown in FIG. 6C, a contact region 202 may include a thickness (T1). In some implementations, the thickness (T1) is included in a range of approximately 10 nanometers to approximately 50 nanometers to provide sufficient photon absorption performance for the sensing region 206. However, other values for the range are within the scope of the present disclosure.

In some implementations, a ratio of the height (H1) to the thickness (T1) may be included in a range of approximately 4:1 to approximately 35:1 to achieve sufficiently low dark current and to achieve sufficient photon absorption in the sensing region 206. However, other values for the range are within the scope of the present disclosure.

As shown in FIG. 6C, a capping layer 412 may include a thickness (T2). In some implementations, the thickness (T2) is included in a range of approximately 10 nanometers to approximately 30 nanometers to provide sufficient protection for the contact region 202. However, other values for the range are within the scope of the present disclosure.

As shown in FIG. 6C, a remote plasma oxide layer 602 may include a thickness (T3). In some implementations, the thickness (T3) is included in a range of approximately 10 nanometers to approximately 30 nanometers. However, other values for the range are within the scope of the present disclosure.

As shown in FIG. 6C, an STI region 410 may include a height (H2). In some implementations, the height (H2) is included in a range of approximately 100 nanometers to approximately 180 nanometers to provide sufficient isolation between the sensing region 206 and the contact region 204 while still enabling electrons 306 to flow under the STI region 410 in the extension region 408. However, other values for the range are within the scope of the present disclosure.

As indicated above, FIGS. 6A-6C are provided as examples. Other examples may differ from what is described with regard to FIGS. 6A-6C.

Figure 7A:
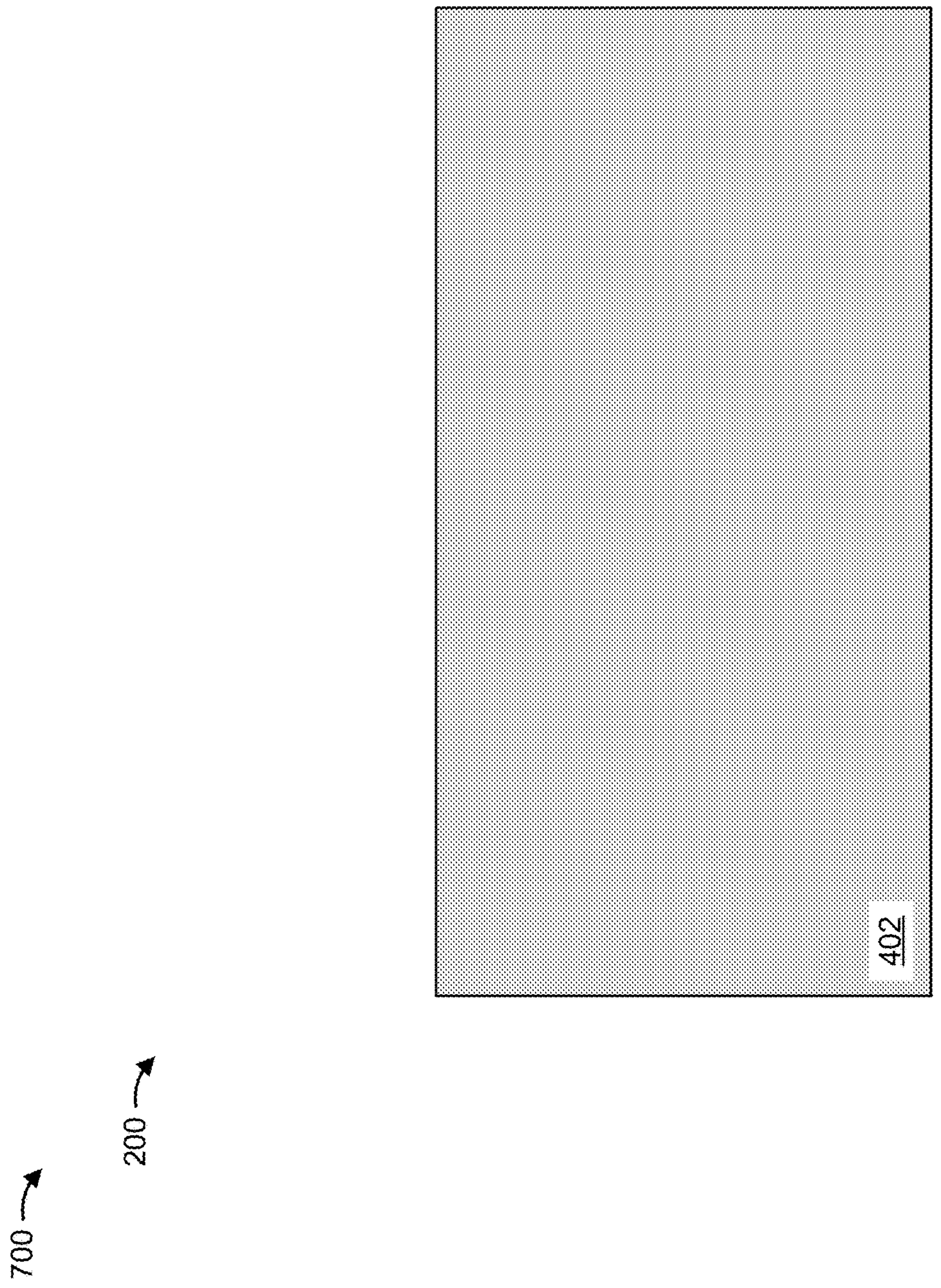
FIGS. 7A-7Q are diagrams of an example implementation described herein.
Figure 7B:
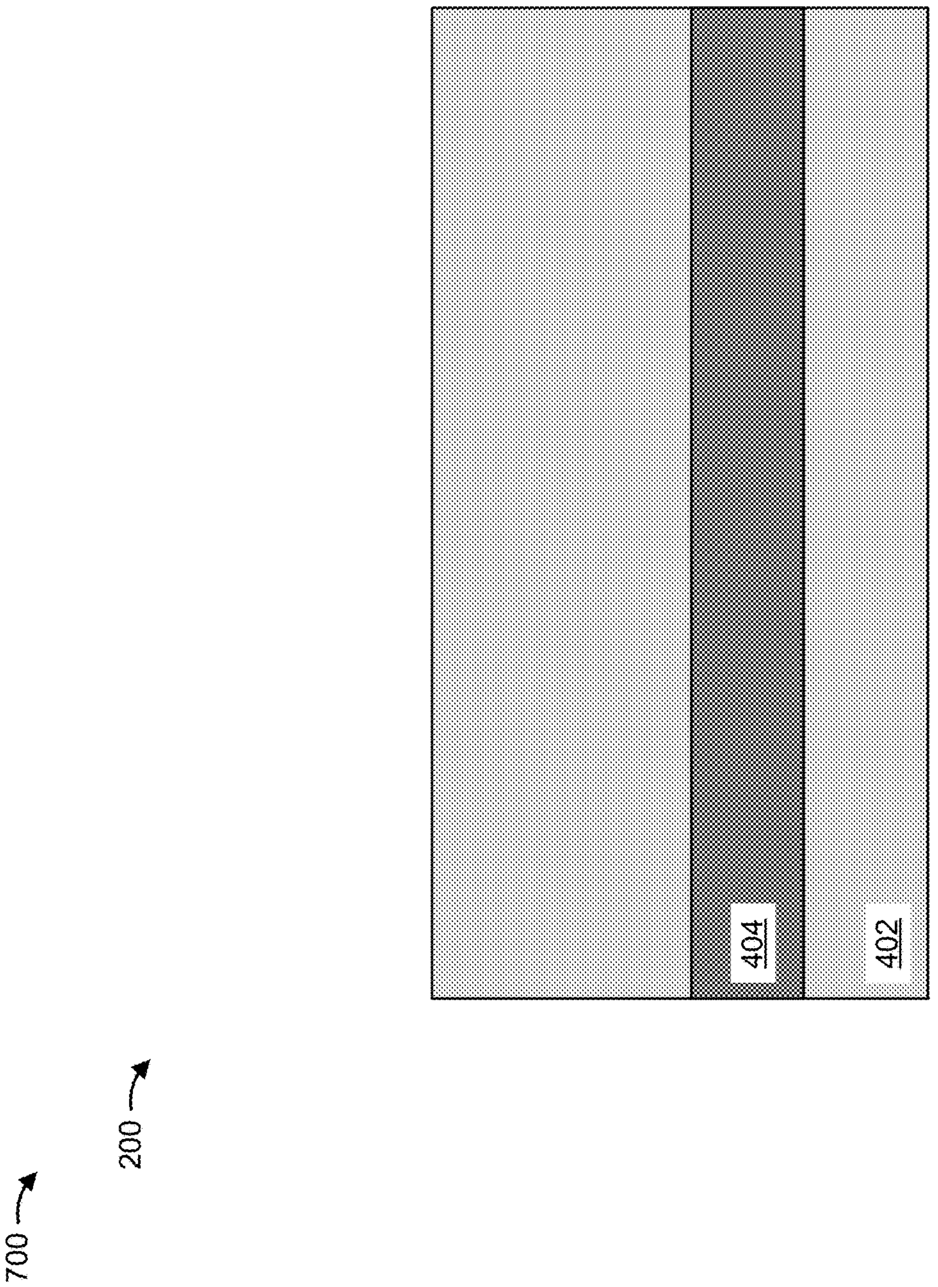
Figure 7C:
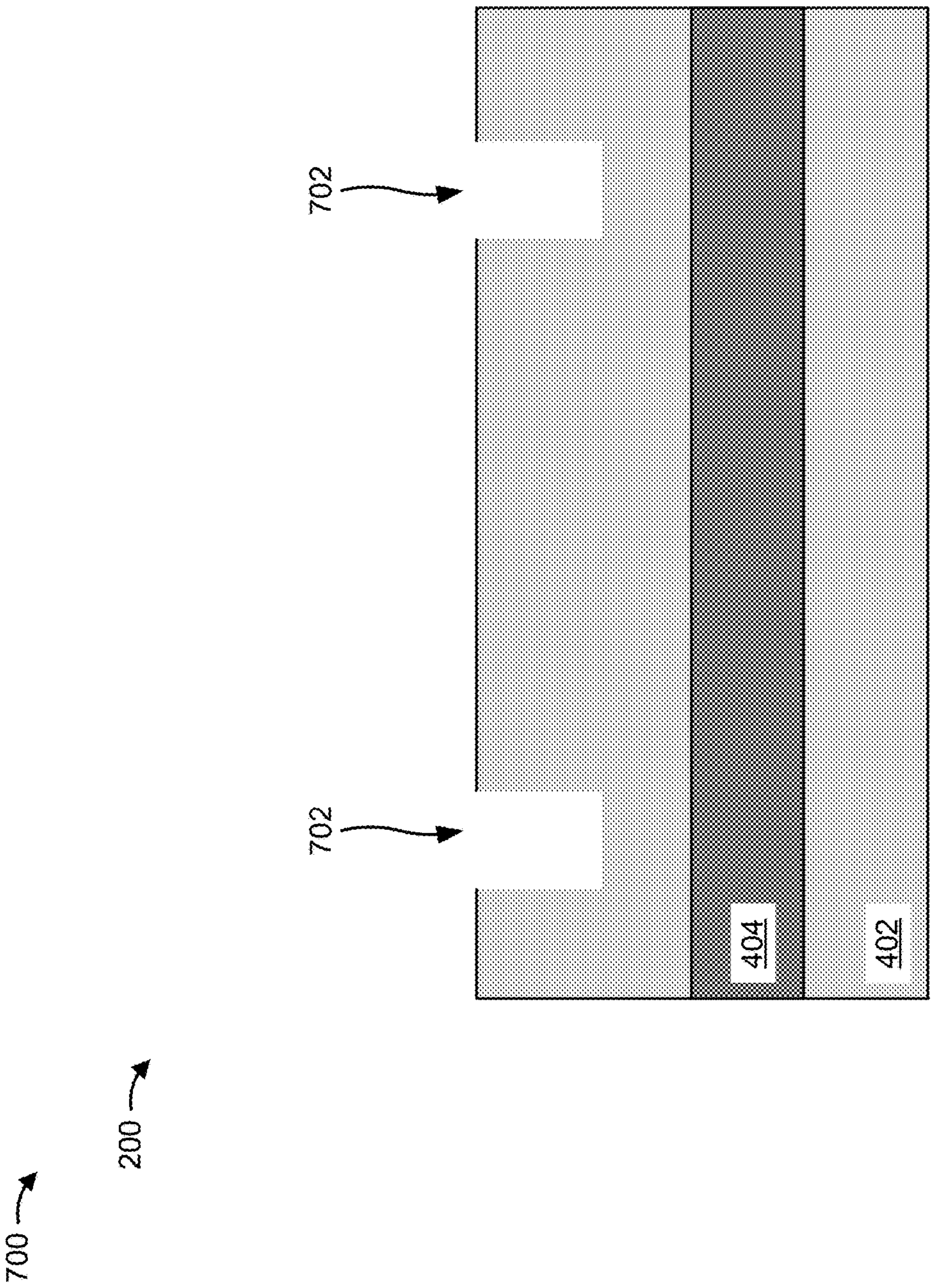
Figure 7D:
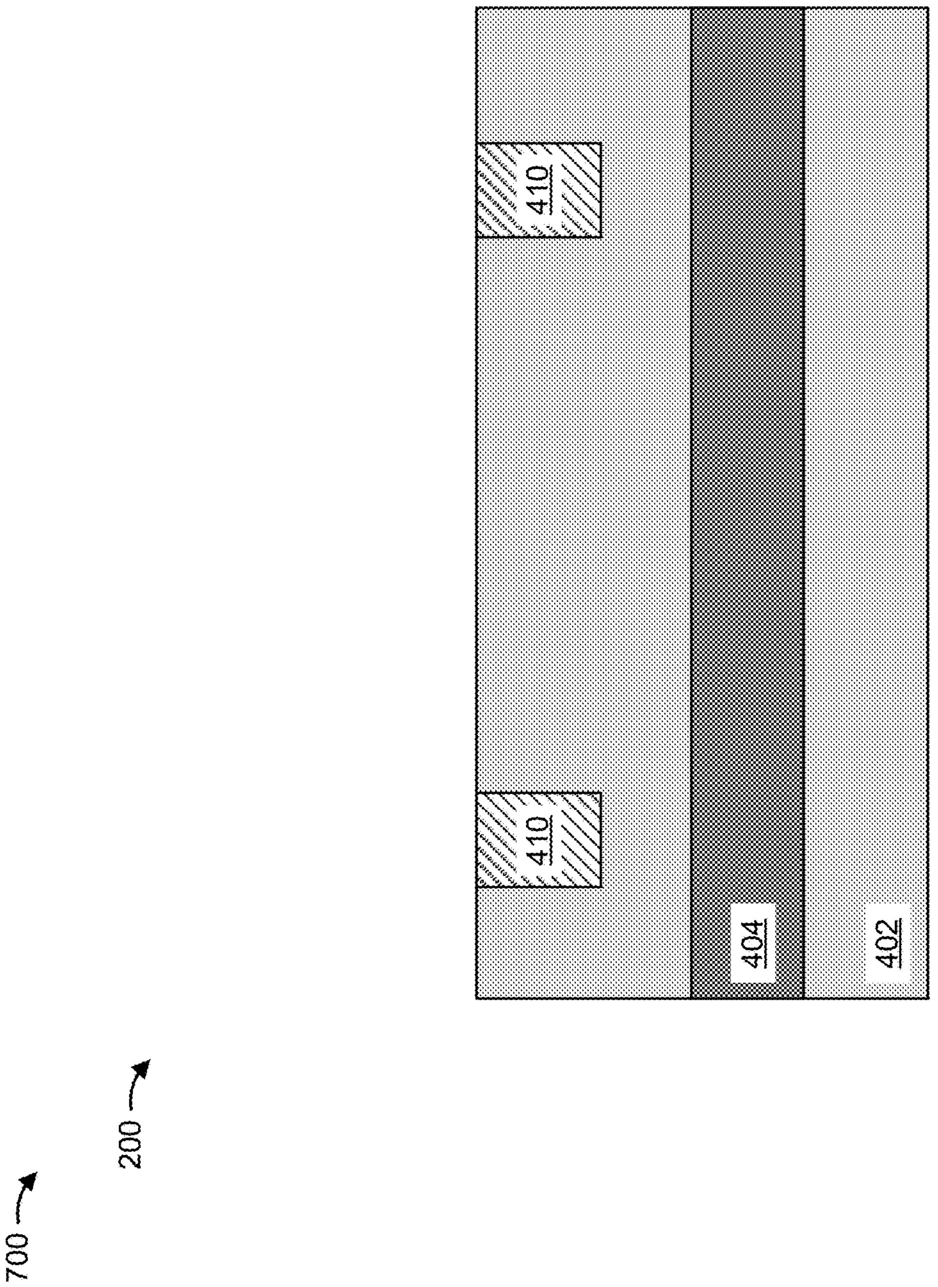
Figure 7E:
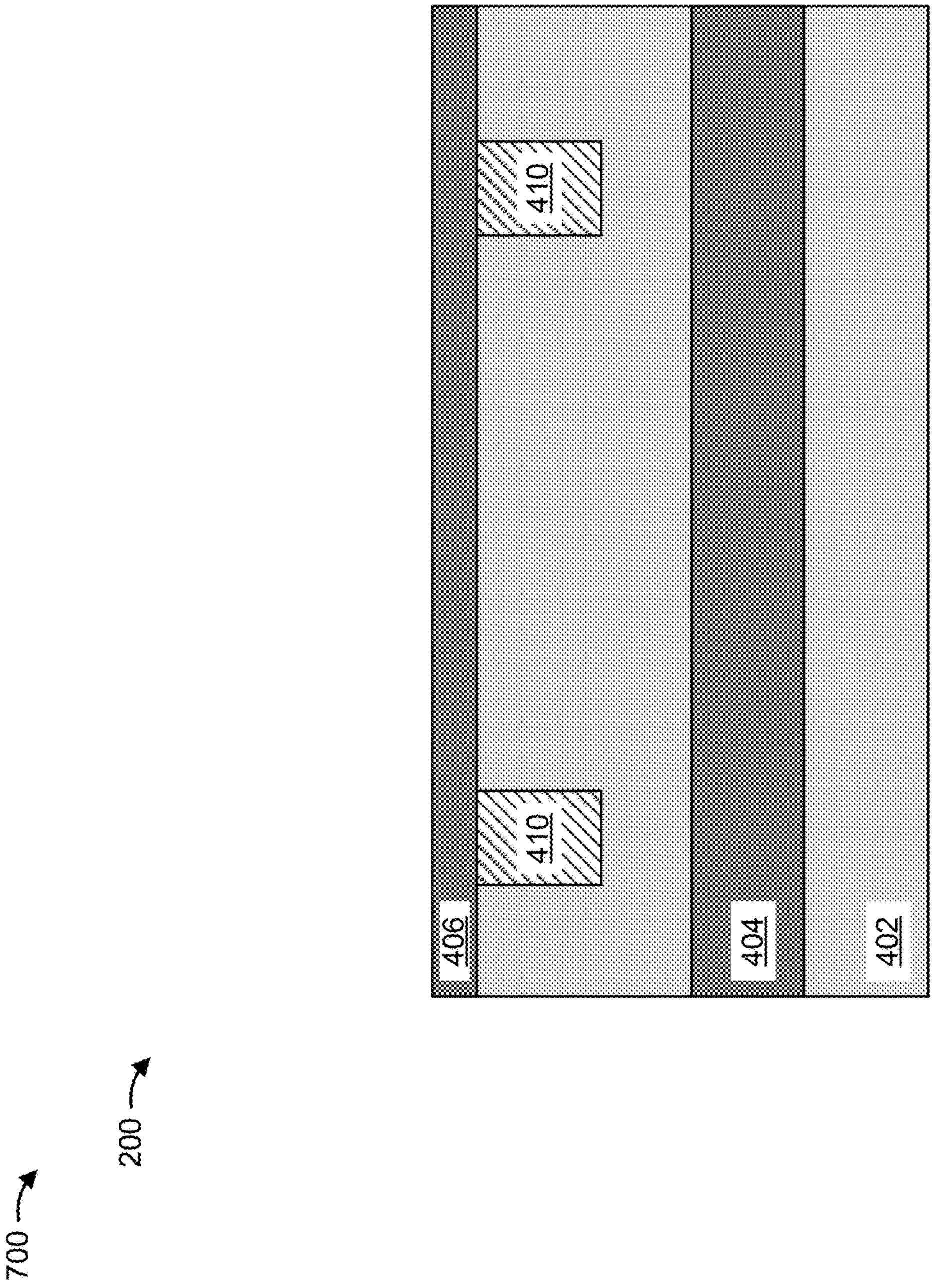
Figure 7F:
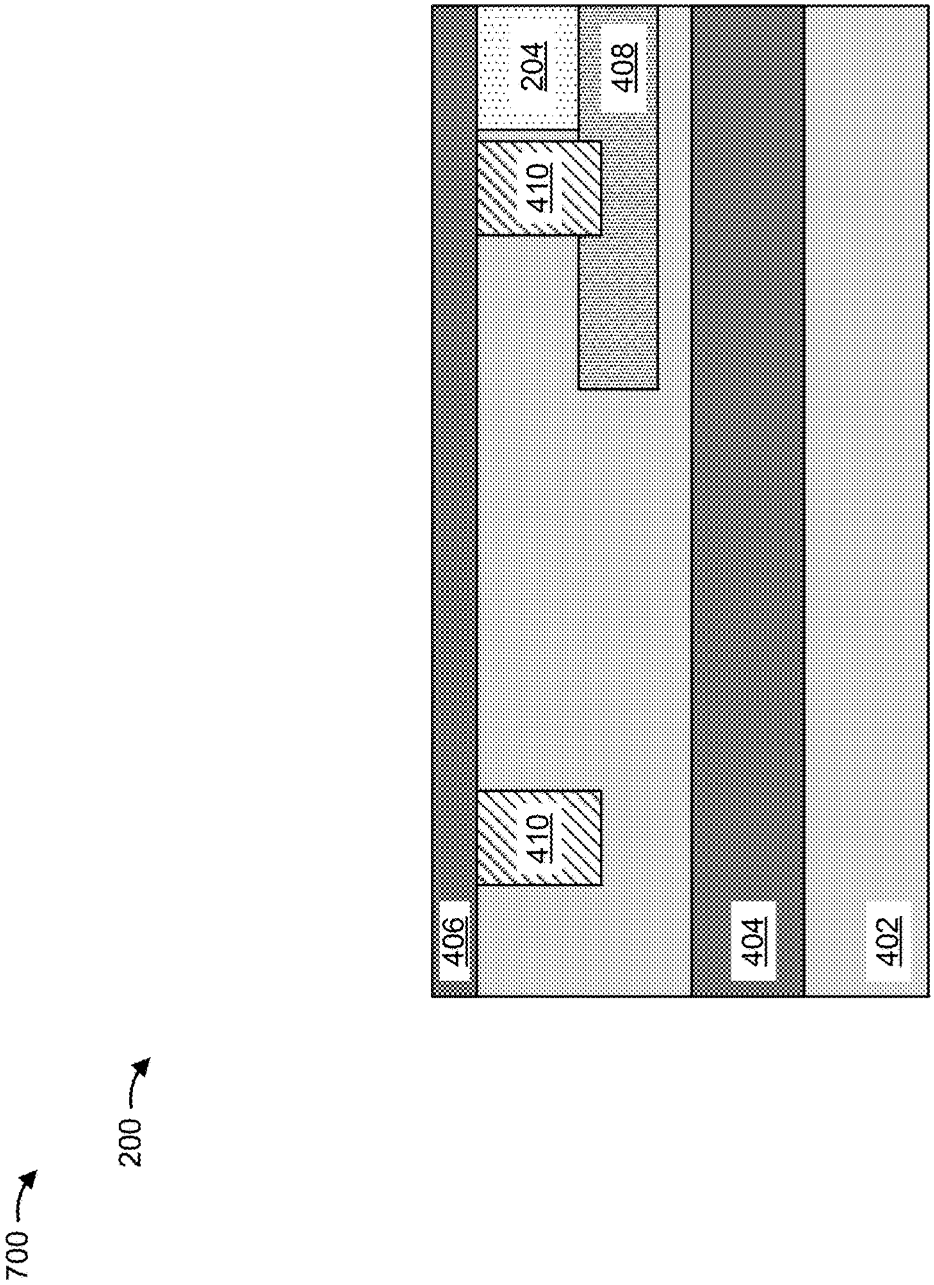
Figure 7G:
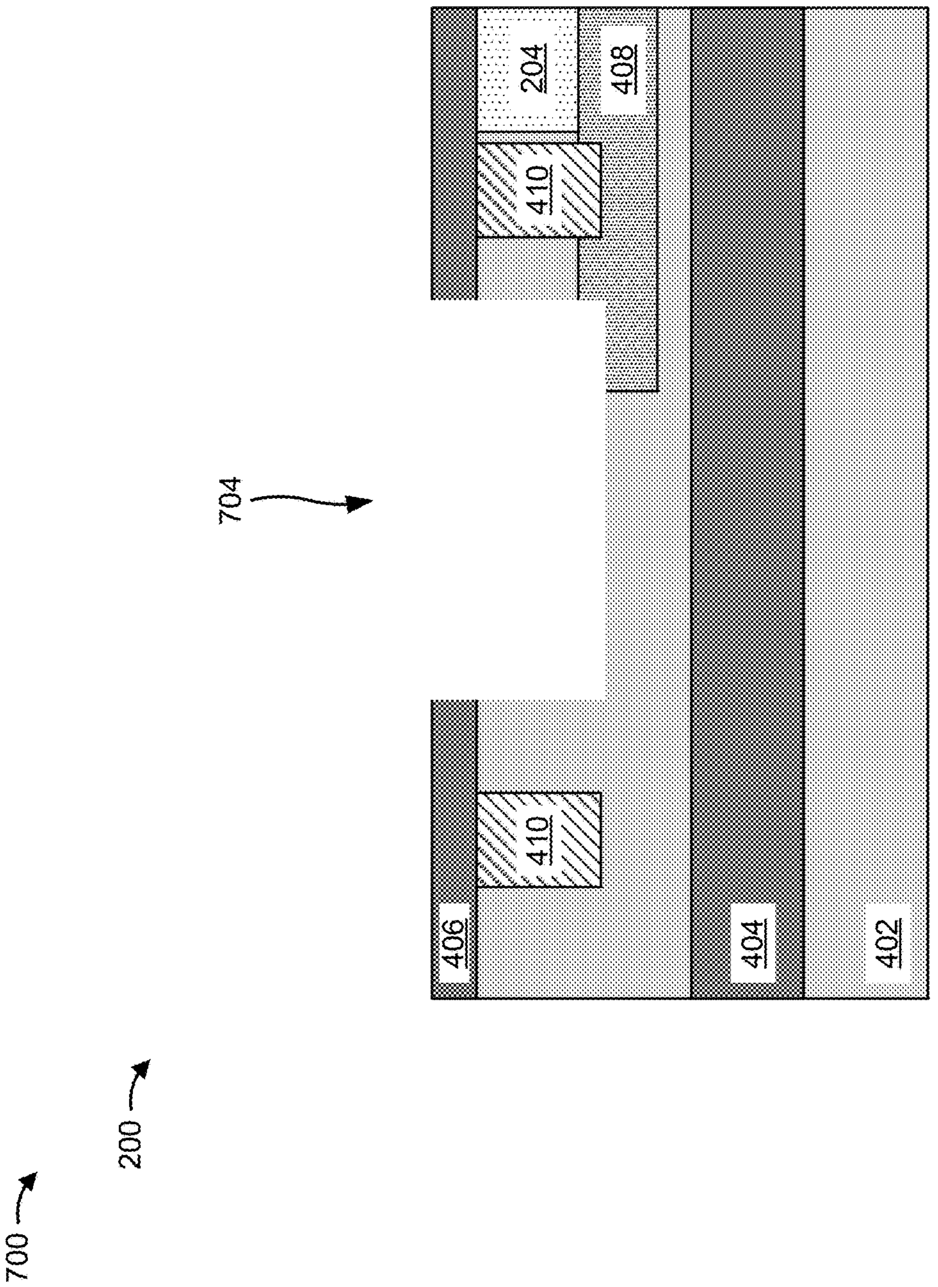
Figure 7H:
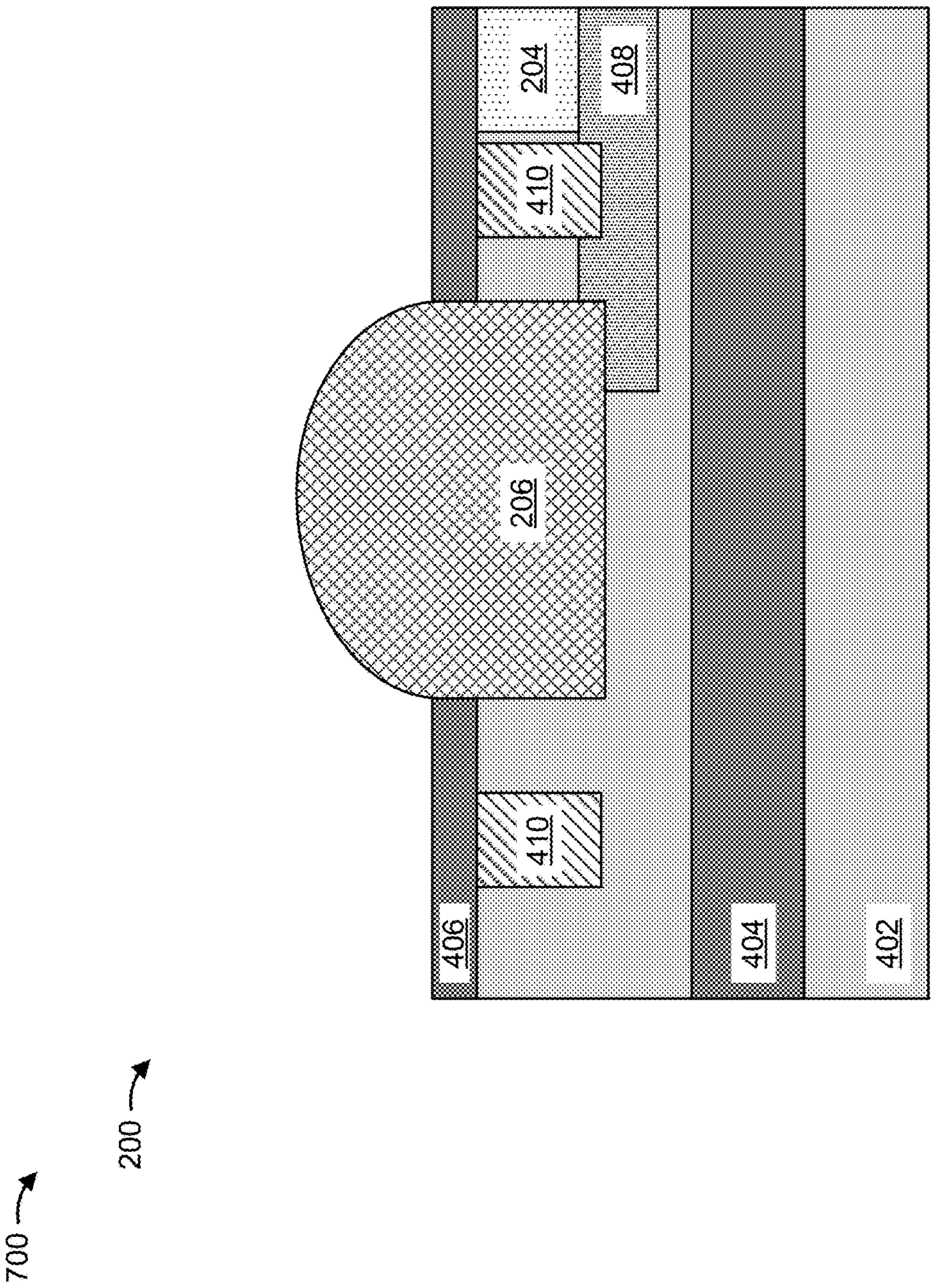
Figure 7I:
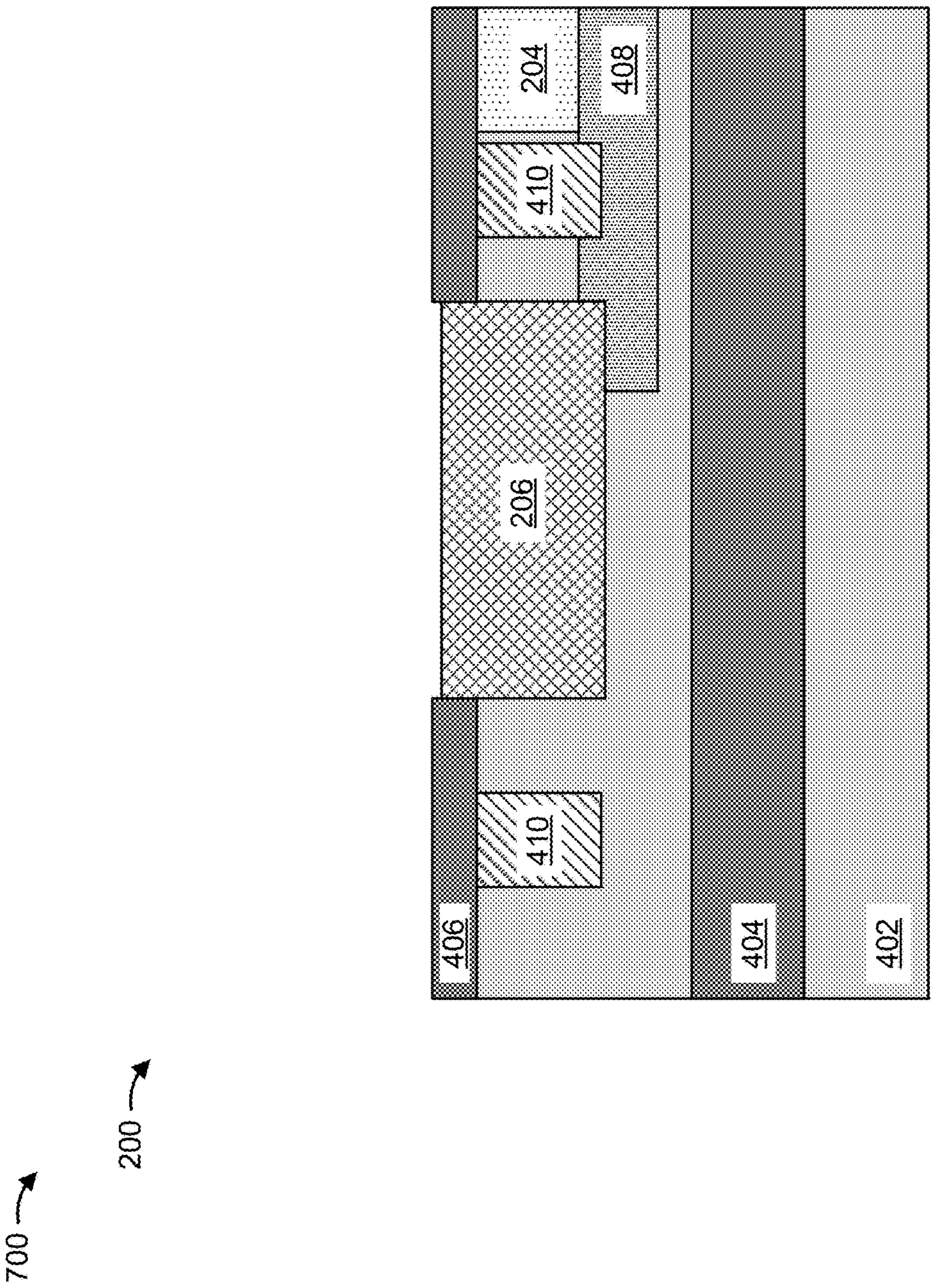
Figure 7J:
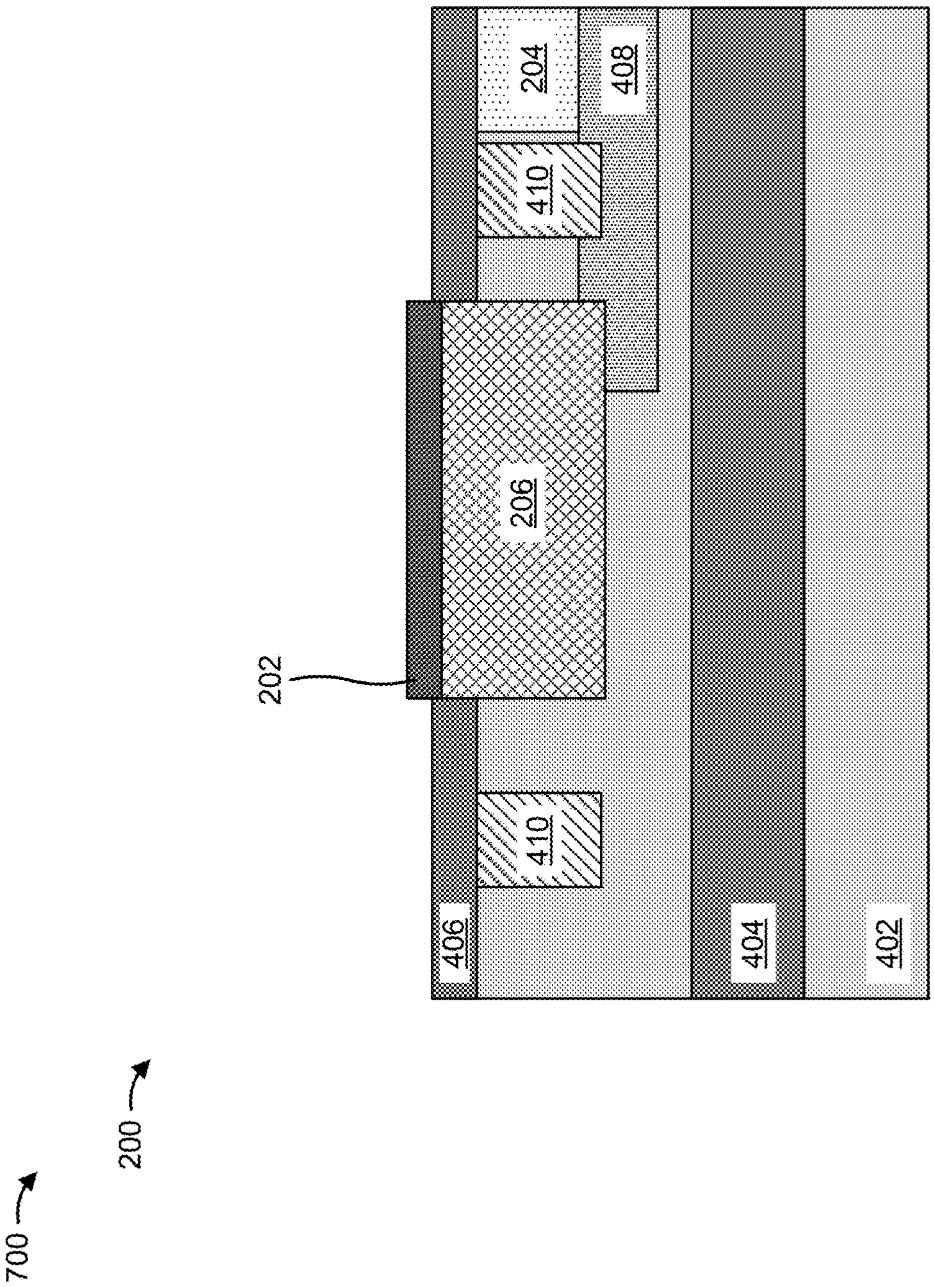
Figure 7K:
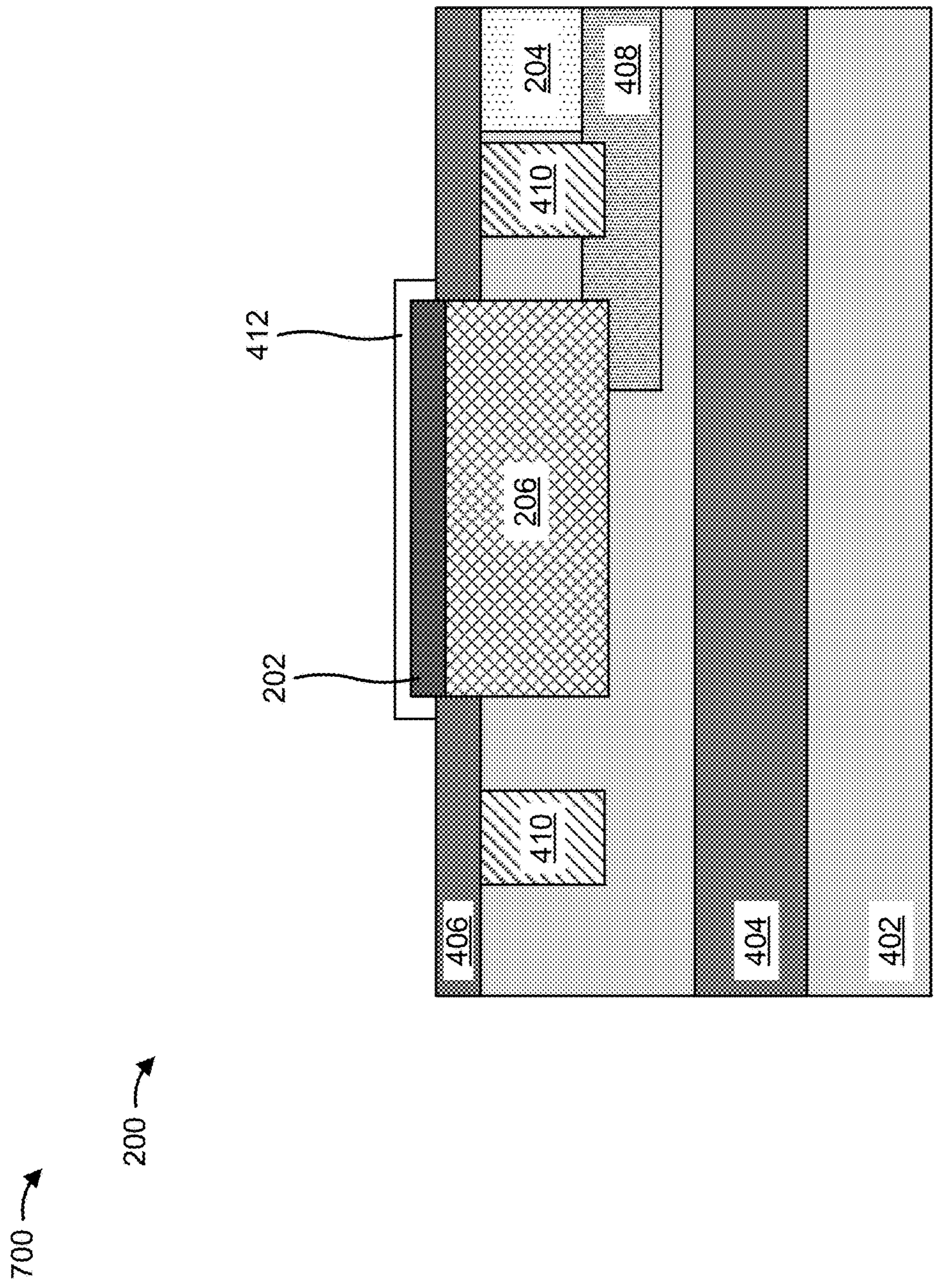
Figure 7L:
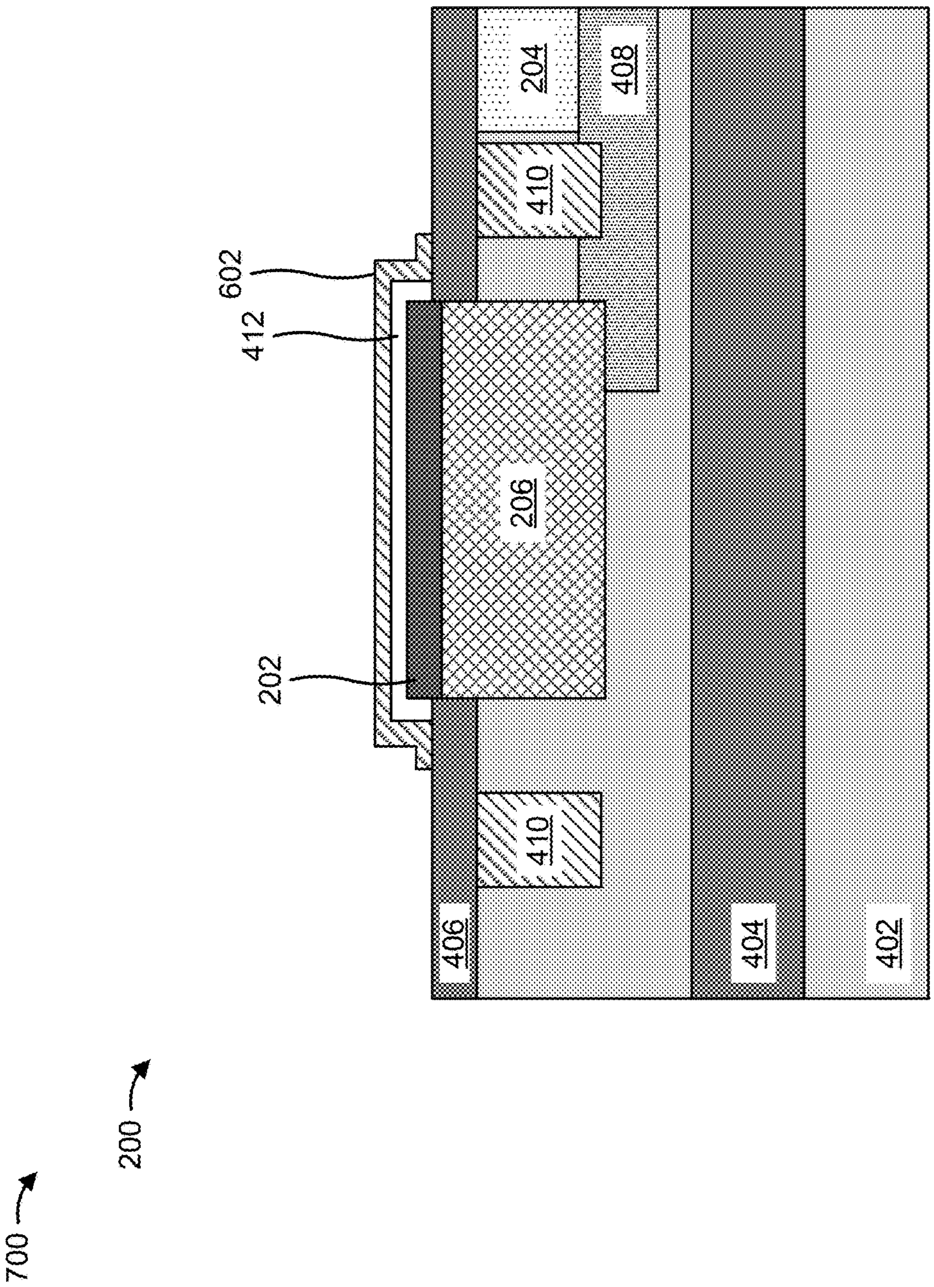
Figure 7M:
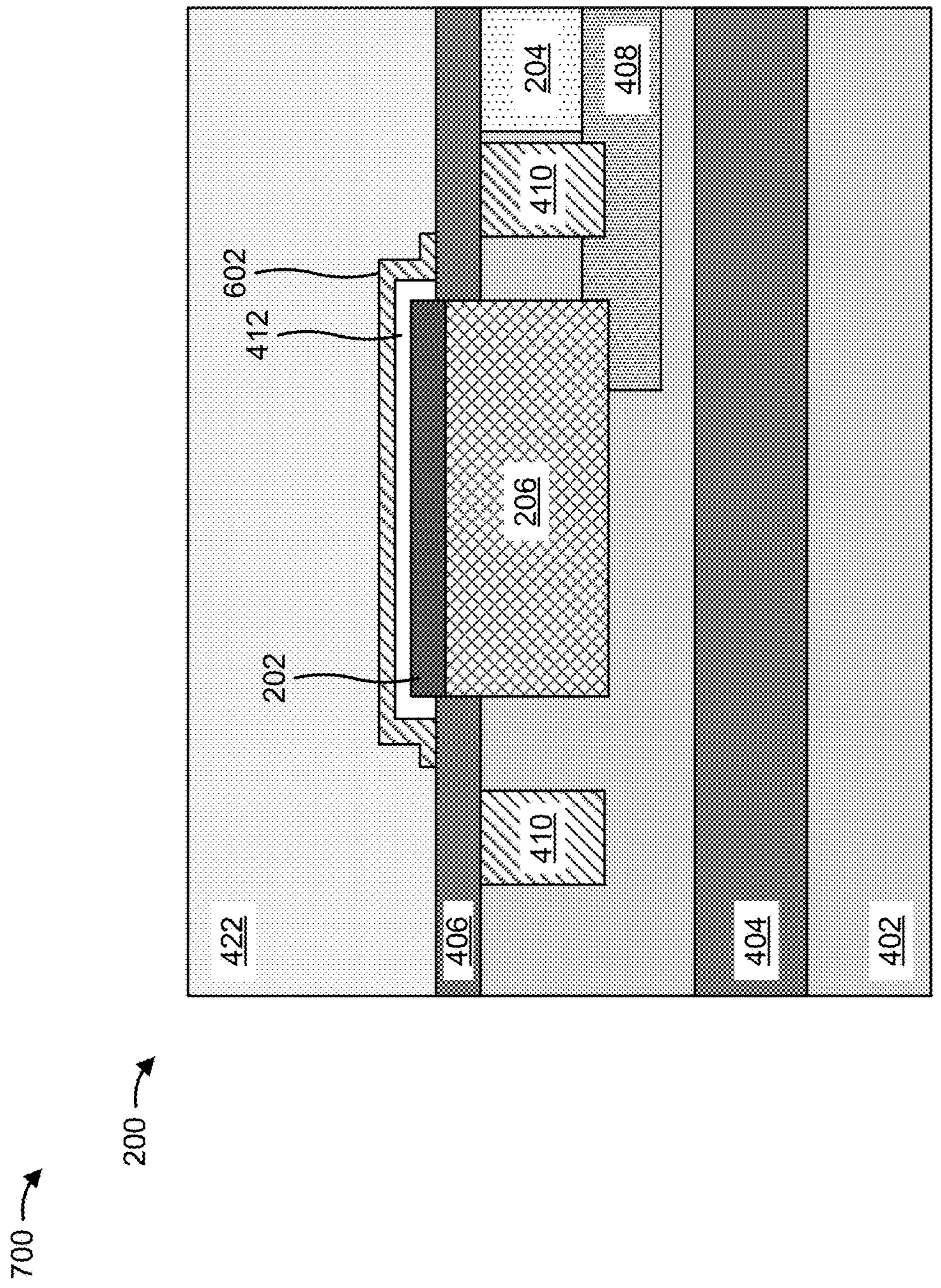
Figure 7N:
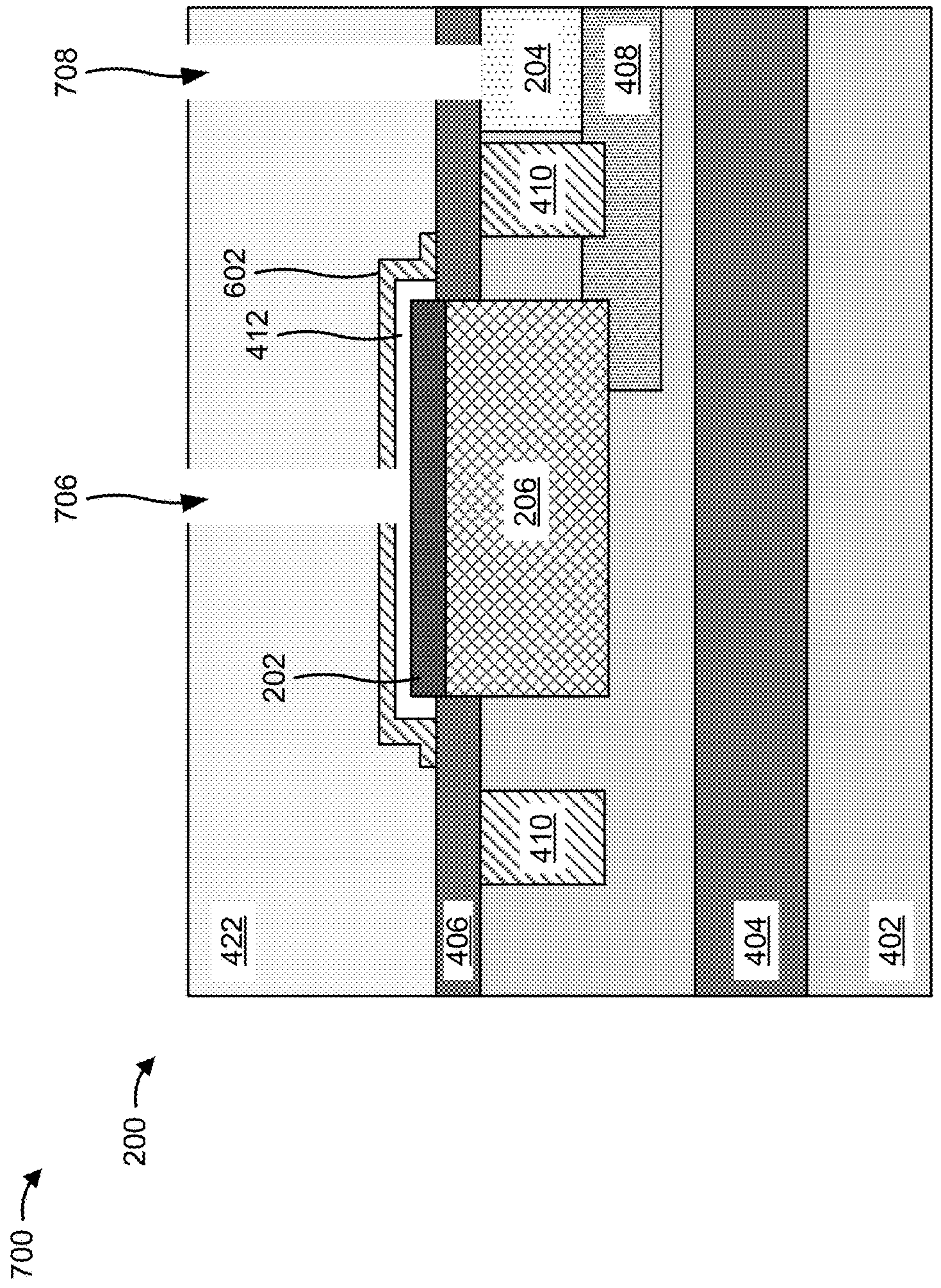
Figure 7O:
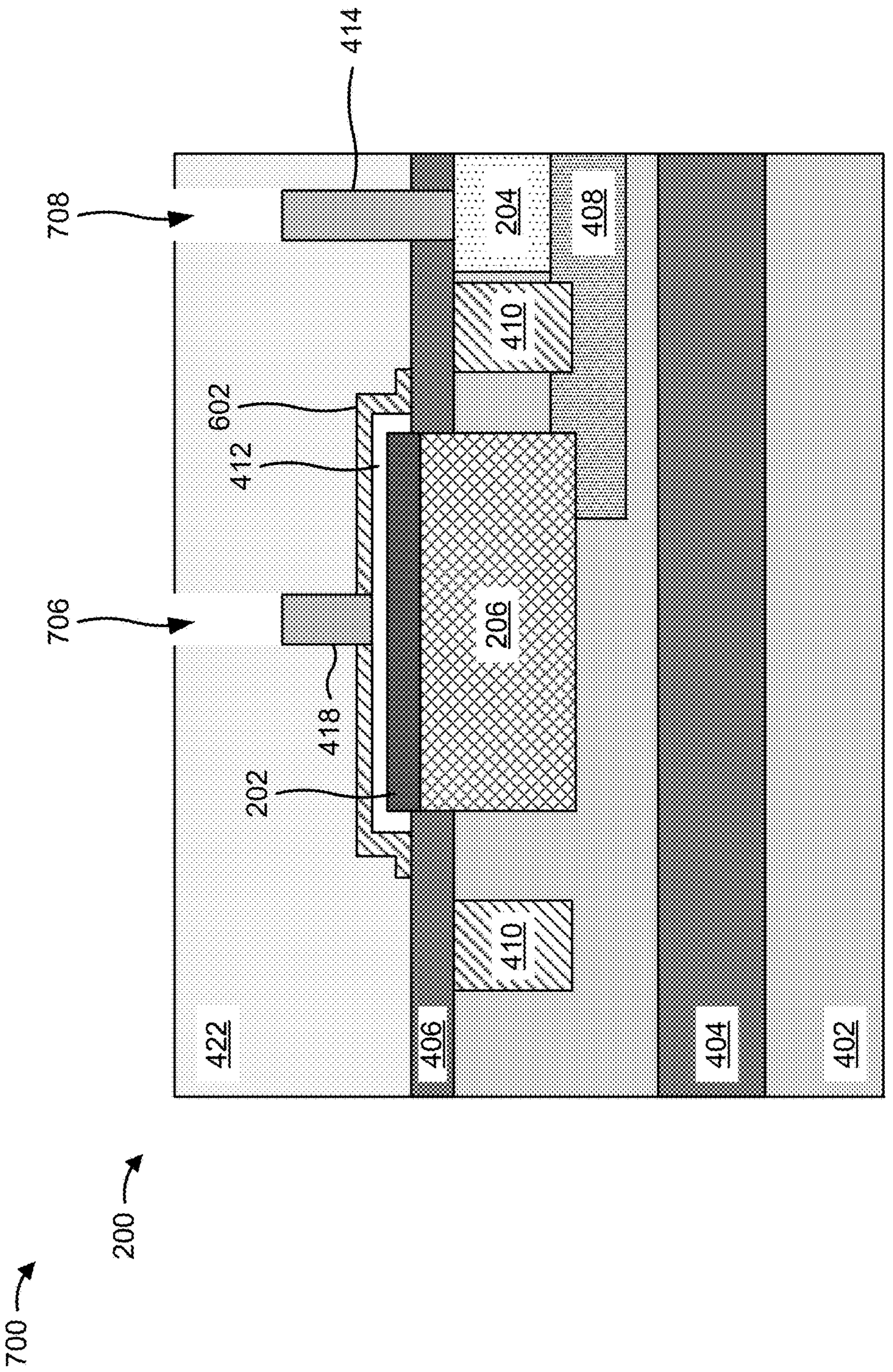
Figure 7P:
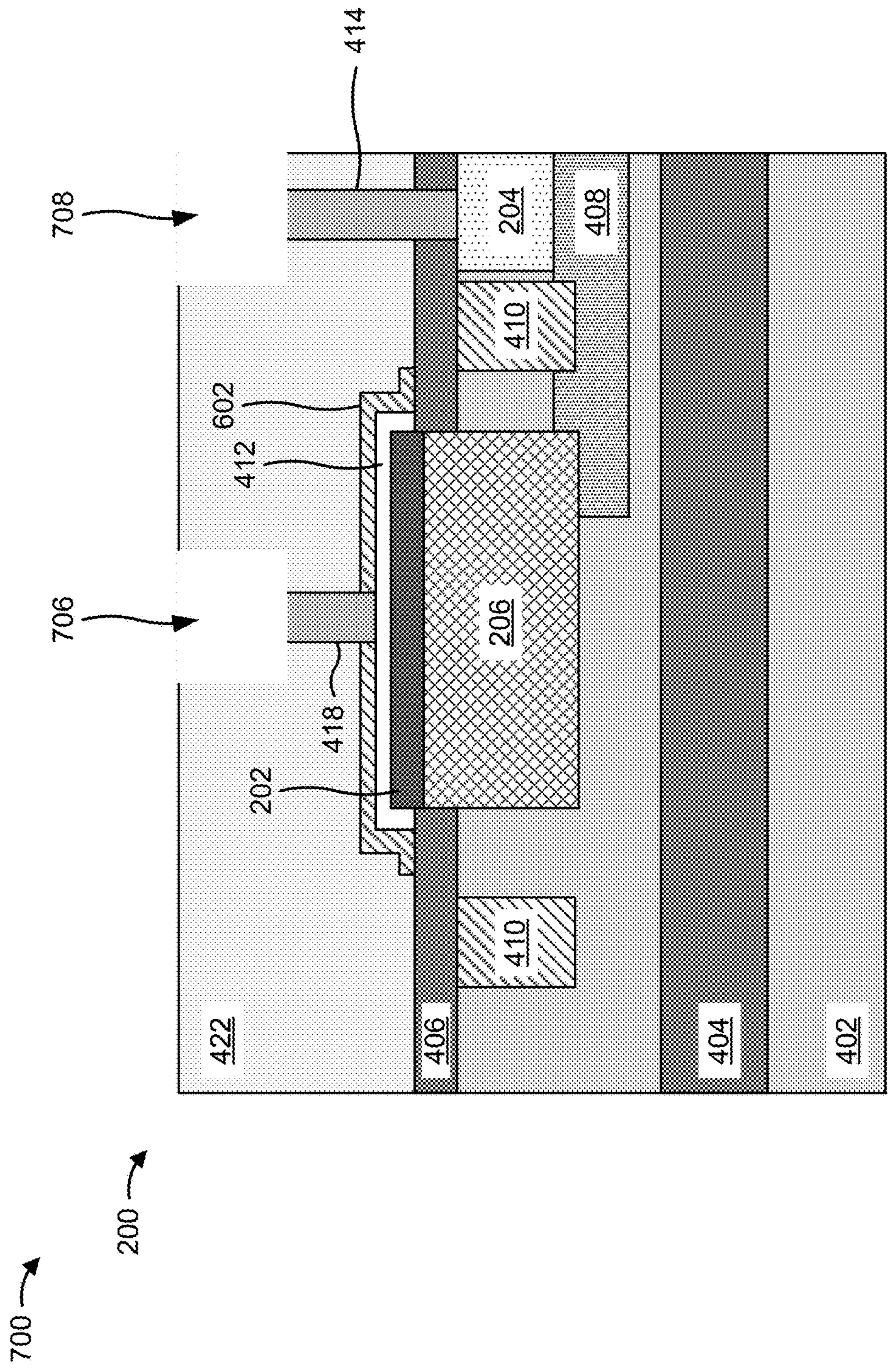
Figure 7Q:
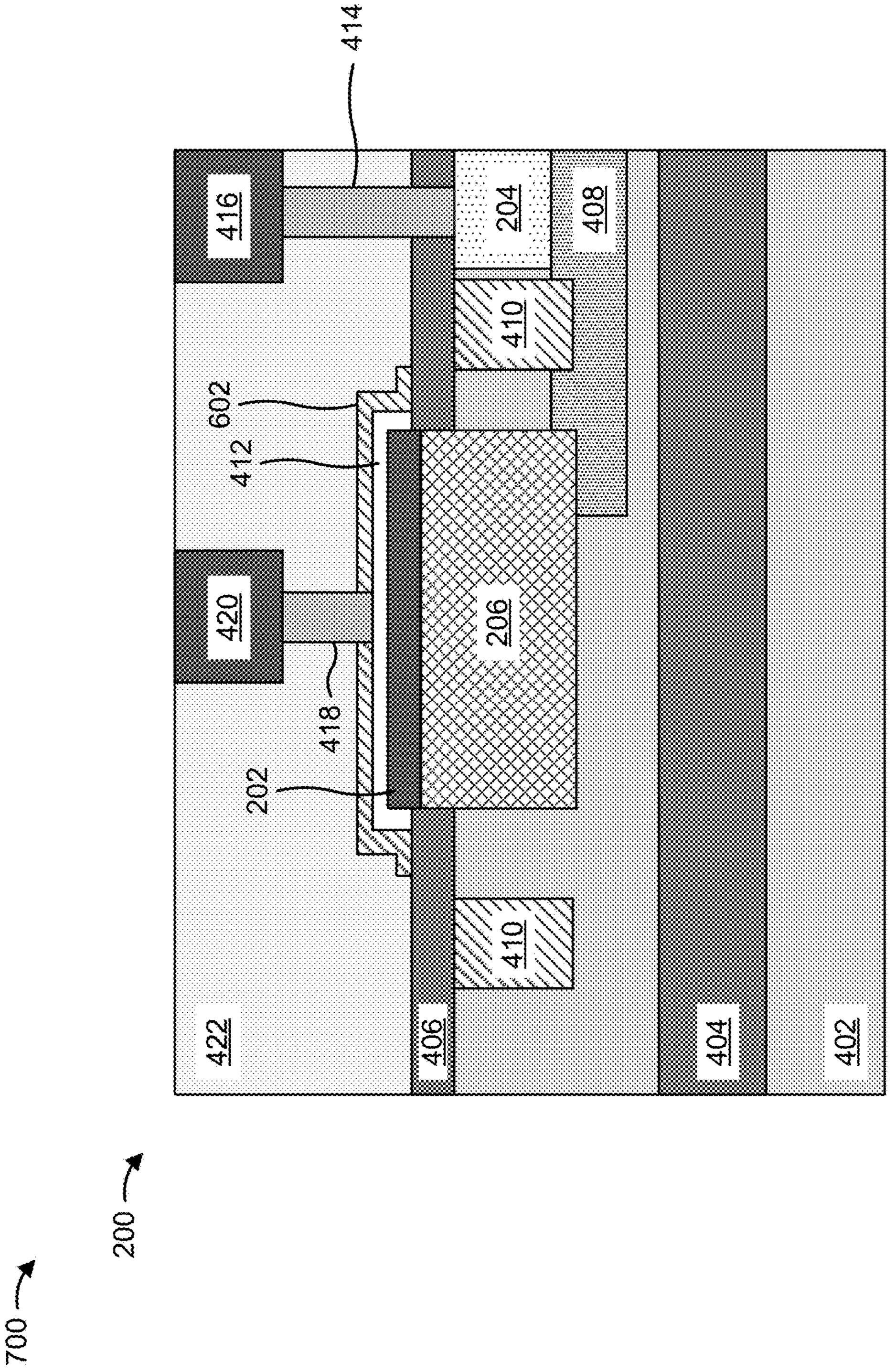

FIGS. 7A-7Q are diagrams of an example implementation 700 described herein. Example implementation 700 may be an example process for forming a photodetector device 200 described herein. As shown in FIG. 7A, the example process for forming the pixel sensor 300 may be performed in connection with the substrate 402.

As shown in FIG. 7B, the buried oxide 404 may be formed in the substrate 402. In some implementations, the ion implantation tool 114 uses an ion implantation technique to implant ions into the substrate 402 to form the buried oxide 404. In some implementations, the deposition tool 102 deposits or grows the buried oxide 404 on the substrate 402 by epitaxy, and then deposits a remaining portion of the substrate 402 on the buried oxide 404. In some implementations, an oxidation technique is used to oxidize a surface of the substrate 402 to form the buried oxide 404, and then a remaining portion of the substrate 402 is formed on the buried oxide 404.

As shown in FIG. 7C, the substrate 402 may be etched to form a recess 702 in the substrate 402 of the photodetector device 200. The recess 702 may include a trench, an opening, a hole, and/or another type of recess. In some implementations, one or more of the semiconductor processing tools 102-116 form the recess 702 based on one or more masking layers that are formed on the substrate 402. The deposition tool 102 may form the one or more masking layers and a photoresist layer on the one or more masking layers. The exposure tool 104 may expose the photoresist layer to a radiation source to pattern the photoresist layer. The developer tool 106 may develop and remove portions of the photoresist layer to expose the pattern. The etch tool 108 may etch portions of the one or more masking layers to form a pattern in the one or more masking layers. The etch tool 108 may then etch into the substrate 402 from the top surface of the substrate 402 to form the recess 702 based on the pattern in the one or more masking layers. In some implementations, a photoresist removal tool removes the remaining portions of the photoresist layer (e.g., using a chemical stripper, a plasma asher, and/or another technique) after the etch tool 108 etches the substrate 402 to form the recess 702. In some implementations, one or more of the semiconductor processing tools 102-116 form the recess 702 in the substrate 402 based on a pattern in a photoresist without the use of masking layers.

As shown in FIG. 7D, the recess 702 may be filled with an oxide material to form the STI region(s) 410 in the substrate 402 of the photodetector device 200. The deposition tool 102 may perform one or more deposition operations to form the STI region(s) 410 in the recess 702, which may include an ALD operation, a CVD operation, an epitaxial operation, a PVD operation, and/or another type of deposition operation. The planarization tool 110 may perform a planarization operation to planarize the STI region(s) 410 after the material of the STI region(s) 410 is deposited in the recess 702. In this way, top surfaces of the STI region(s) 410 may be approximately a same height as the top surface of the substrate 402.

As shown in FIG. 7E, the top oxide 406 may be formed over and/or on the top surface of the substrate 402 and over and/or on the top surfaces of the STI region(s) 410. The deposition tool 102 may perform one or more deposition operations to form the top oxide 406, which may include an ALD operation, a CVD operation, an epitaxial operation, a PVD operation, and/or another type of deposition operation. In some implementations, the planarization tool 110 performs a planarization operation to planarize the top oxide 406 after the material of top oxide 406 is deposited.

As shown in FIG. 7F, the contact region 204 and the extension region 408 may be formed in the substrate. The ion implantation tool 114 may perform one or more ion implantation operations to from the contact region 204 and the extension region 408 in the substrate 402. For example, the ion implantation tool 114 may dope the substrate 402 by performing an ion implantation operation to implant n-type dopants or n-type ions in the substrate 402 to form the extension region 408 under the top oxide 406 and under a portion of one or more of the STI region(s) 410. As anther example, the ion implantation tool 114 may dope the substrate 402 by performing an ion implantation operation to implant n-type dopants or n-type ions in the substrate 402 to form the contact region 204 under the top oxide 406 and adjacent to one or more of the STI region(s) 410. In some implementations, the contact region 204 is formed after the extension region 408 and is formed above a portion of the extension region 408. In some implementations, the extension region 408 is formed after the contact region 204 and is formed below the contact region 204.

As shown in FIG. 7G, another recess 704 is formed through the top oxide 406 into a portion of the substrate 402. In some implementations, the recess 704 is formed adjacent to an STI region 410 that is also adjacent to the contact region 204. Thus, the STI region 410 is between the recess 704 and the contact region 204. In some implementations, the recess 704 is formed between two or more STI regions 410. In some implementations, the recess 704 is formed such that a bottom surface of the recess 704 is a location that is lower in the photodetector device 200 relative to a bottom surface of the STI region 410 that is between the recess 704 and the contact region 204.

In some implementations, one or more of the semiconductor processing tools 102-116 form the recess 704 based on one or more masking layers that are formed on the top oxide 406. The deposition tool 102 may form the one or more masking layers on the top oxide 406 and a photoresist layer on the one or more masking layers. The exposure tool 104 may expose the photoresist layer to a radiation source to pattern the photoresist layer. The developer tool 106 may develop and remove portions of the photoresist layer to expose the pattern. The etch tool 108 may etch portions of the one or more masking layers to form a pattern in the one or more masking layers. The etch tool 108 may then etch through the top oxide 406 and into the substrate 402 from the top surface of the substrate 402 to form the recess 704 based on the pattern in the one or more masking layers. In some implementations, a photoresist removal tool removes the remaining portions of the photoresist layer (e.g., using a chemical stripper, a plasma asher, and/or another technique) after the etch tool 108 etches the top oxide 406 and the substrate 402 to form the recess 704. In some implementations, one or more of the semiconductor processing tools 102-116 form the recess 704 in the top oxide 406 and the substrate 402 based on a pattern in a photoresist without the use of masking layers.

As shown in FIG. 7H, the sensing region 206 may be formed in the recess 704. Accordingly, the sensing region 206 may be formed in the substrate 402 adjacent to the contact region 204. Moreover, the sensing region 206 may be formed such that an STI region 410 is between the contact region 204 and the sensing region 206.

The deposition tool 102 may perform one or more epitaxy operations to deposit or grow germanium (e.g., bulk germanium) in the recess 704 to form the sensing region 206. The deposition tool 102 may form the sensing region 206 such that a top surface of the sensing region 206 extends above the top surface of the top oxide 406. This ensures that the recess 704 is fully filled with the germanium of the sensing region 206.

In some implementations, the annealing tool 106 may perform one or more annealing operations to anneal the sensing region 206 after the sensing region 206 is deposited. The one or more annealing operations may be performed to remove defects in the epitaxially grown germanium of the sensing region 206. In some implementations, one or more cycles are performed in which a first portion of the sensing region is deposited and then annealed, a second portion of the sensing region is deposited and then annealed, and so on. The use of a plurality of cycles may enable more effective removal of defects and/or may enable the removal of defects that are located deeper in the epitaxially grown germanium of the sensing region 206. In some cases, a single anneal operation may not be able to remove defects located at the bottom of the sensing region 206 depending on the depth of the sending region 206. The use of a plurality of cycles enables incremental removal of defects as the sending region 206 is deposited. Accordingly, defects that are located at the bottom of the sensing region 206 may be removed before the sensing region 206 is fully formed, in that an anneal operation may be performed for the material deposited at the bottom sensing region 206 prior to depositing additional material for the sensing region 206. Similar cyclical operations may be performed for the middle and top portions of the sensing region 206.

As shown in FIG. 7I, the top surface of the sensing region 206 is rounded or curved after sensing region 206 is deposited. The roundness of the top surface of the sensing region 206 may increase the difficulty of landing the contact 418 over the sensing region 206, which may increase the likelihood of defect formation and/or device failure in the photodetector device 200.

Accordingly, the planarization tool 110 may perform a planarization operation to planarize the sensing region 206. The planarization tool 110 may planarize the top surface of the sensing region 206 such that the top surface of the sensing region 206 is approximately flat. The top surface of the sensing region 206 being approximately flat reduces the likelihood of defect formation when forming the contact 418 over the sensing region 206.

In some implementations, the planarization tool 110 may planarize the sensing region 206 such that a height of the top surface of the sensing region 206 and a height of the top surface of the top oxide 406 in the photodetector device 200 are approximately equal. In some implementations, dishing may occur during the planarization operation, in which case the height of the top surface of the sensing region 206 may be lower than the height of the top surface of the top oxide 406 in the photodetector device 200.

As shown in FIG. 7J, the contact region 202 may be formed over and/or on the sensing region 206. The deposition tool 102 may perform one or more epitaxy operations to deposit or grow the p-doped germanium (e.g., germanium that is doped with one or more p-type dopants) over and/or on the sensing region 206. In some implementations, the deposition tool 102 uses a selective epitaxy technique to form the contact region 202 on the sensing region 206 and not on the top oxide 406. In some implementations, one or more of the semiconductor processing tools 102-116 may perform one or more surface treatment operations prior to formation of the contact region 202 to increase the deposition selectivity for the contact region 202 when performing the selective epitaxy technique.

As shown in FIG. 7K, the capping layer 412 may be formed over and/or on the contact region 202. In particular, the capping layer 412 may be formed over and/or on the top surface of the contact region 202. In some implementations, the capping layer 412 is also formed over and/or on at least a portion of one or more sidewalls of the contact region 202.

The deposition tool 102 may perform one or more epitaxy operations to deposit or grow the p-doped silicon (e.g., silicon that is doped with one or more p-type dopants) over and/or on the contact region 202. In some implementations, the deposition tool 102 uses a selective epitaxy technique to form the capping layer 412 on the contact region 202 and not on the top oxide 406. In some implementations, one or more of the semiconductor processing tools 102-116 may perform one or more surface treatment operations prior to formation of the capping layer 412 to increase the deposition selectivity for the capping layer 412 when performing the selective epitaxy technique.

As shown in FIG. 7L, the remote plasma oxide layer 602 may be formed over and/or on the capping layer 412. In some implementations, the remote plasma oxide layer 602 is formed over and/or on the top surface of the capping layer 412. In some implementations, the remote plasma oxide layer 602 is formed over and/or on at least a portion of one or more sidewalls of the capping layer 412. In some implementations, the remote plasma oxide layer 602 is formed over and/or on at least a portion of the top surface of the top oxide 406.

The deposition tool 102 may perform one or more deposition operations to form the remote plasma oxide layer 602, which may include an ALD operation, a CVD operation, an epitaxial operation, a PVD operation, and/or another type of deposition operation. In some implementations, the deposition tool 102 selectively deposits the remote plasma oxide layer 602. In some implementations, the deposition tool 102 deposits the remote plasma oxide layer 602 by blanket deposition, and the etch tool 108 performs an etch back operation to remove one or more portions of the remote plasma oxide layer 602.

As shown in FIG. 7M, the dielectric layer 422 may be formed over and/or on the top oxide 406 and over and/or on the remote plasma oxide layer 602. The deposition tool 102 may perform one or more deposition operations to form the dielectric layer 422, which may include an ALD operation, a CVD operation, an epitaxial operation, a PVD operation, and/or another type of deposition operation. In some implementations, the planarization tool 110 performs a planarization operation to planarize the dielectric layer 422 after the material of dielectric layer 422 is deposited.

As shown in FIG. 7N, recesses may be formed in the dielectric layer 422. A recess 706 may be formed over the sensing region 206, over the contact region 202, over the capping layer 412, and over the remote plasma oxide layer 602. The recess 706 may be formed from the top surface of the dielectric layer 422 and through the dielectric layer 422, through the remote plasma oxide layer 602, through the capping layer 412, and to the top surface of the contact region 202. A recess 708 may be formed over the contact region 204. The recess 708 may be formed from the top surface of the dielectric layer 422 and through the dielectric layer 422, through the top oxide 406, and to the top surface of the contact region 204.

In some implementations, one or more of the semiconductor processing tools 102-116 form the recesses 706 and 708 based on one or more masking layers that are formed on the dielectric layer 422. The deposition tool 102 may form the one or more masking layers on the dielectric layer 422 and a photoresist layer on the one or more masking layers. The exposure tool 104 may expose the photoresist layer to a radiation source to pattern the photoresist layer. The developer tool 106 may develop and remove portions of the photoresist layer to expose the pattern. The etch tool 108 may etch portions of the one or more masking layers to form a pattern in the one or more masking layers. The etch tool 108 may then etch the top oxide 406, the capping layer 412, the dielectric layer 422, and/or the remote plasma oxide layer 602 based on the pattern in the one or more masking layers to form the recesses 706 and 708. In some implementations, a photoresist removal tool removes the remaining portions of the photoresist layer (e.g., using a chemical stripper, a plasma asher, and/or another technique) after the recesses 706 and 708 are formed. In some implementations, one or more of the semiconductor processing tools 102-116 form the recesses 706 and 708 based on a pattern in a photoresist without the use of masking layers.

As shown in FIG. 7O, the contact 414 may be formed in the recess 708 over the contact region 204, and the contact 418 may be formed in the recess 706 over the contact region 202. The contact 414 may be electrically coupled to the contact region 204, and the contact 418 may be electrically coupled to the contact region 202. The deposition tool 102 may deposit the material of the contacts 414 and 418 using a CVD technique, a PVD technique, an ALD technique, or another type of deposition technique, the plating tool 112 may deposit the material of the contacts 414 and 418 using an electroplating operation, or a combination thereof. In some implementations, a silicide layer is formed over the contact region 202 and/or over the contact region 204 prior to contact formation to reduce contact resistance between the contact region 202 and the contact 418 and/or between the contact region 204 and the contact 414.

As shown in FIG. 7P, the recesses 706 and 708 may be enlarged in preparation for metallization layer formation. In some implementations, the etch tool 108 performs one or more etch operations to increase the width of the recess 706 and 708. Alternatively, another dielectric layer may be formed over the dielectric layer 422, and recesses may be formed in the other dielectric layer in preparation form metallization layer formation.

As shown in FIG. 7Q, the metallization layer 416 may be formed in the recess 708 over the contact 414, and the metallization layer 420 may be formed in the recess 706 over the contact 418. The metallization layer 416 may be electrically coupled to the contact 414, and the metallization layer 420 may be electrically coupled to the contact 418. The deposition tool 102 may deposit the material of the metallization layers 416 and 420 using a CVD technique, a PVD technique, an ALD technique, or another type of deposition technique, the plating tool 112 may deposit the material of the metallization layers 416 and 420 using an electroplating operation, or a combination thereof. In some implementations, the planarization tool 110 performs a planarization operation to planarize the metallization layers 416 and 420 after the material of metallization layers 416 and 420 is deposited.

As indicated above, FIGS. 7A-7Q are provided as an example. Other examples may differ from what is described with regard to FIGS. 7A-7Q.

Figure 8:
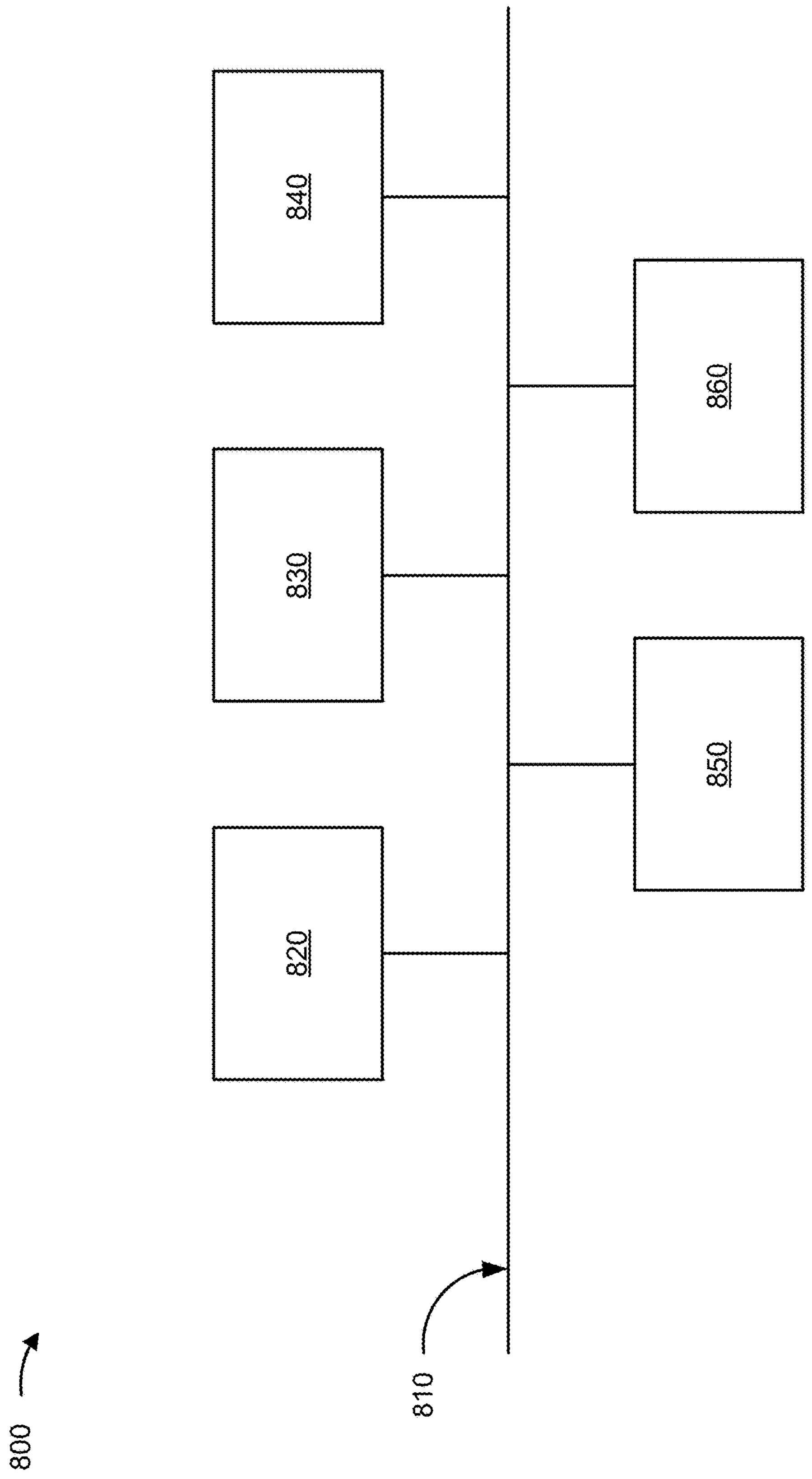
FIG. 8 is a diagram of example components of one or more devices of FIG. 1 described herein.

FIG. 8 is a diagram of example components of a device 800. In some implementations, one or more of the semiconductor processing tools 102-116 and/or the wafer/die transport tool 118 include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry is used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
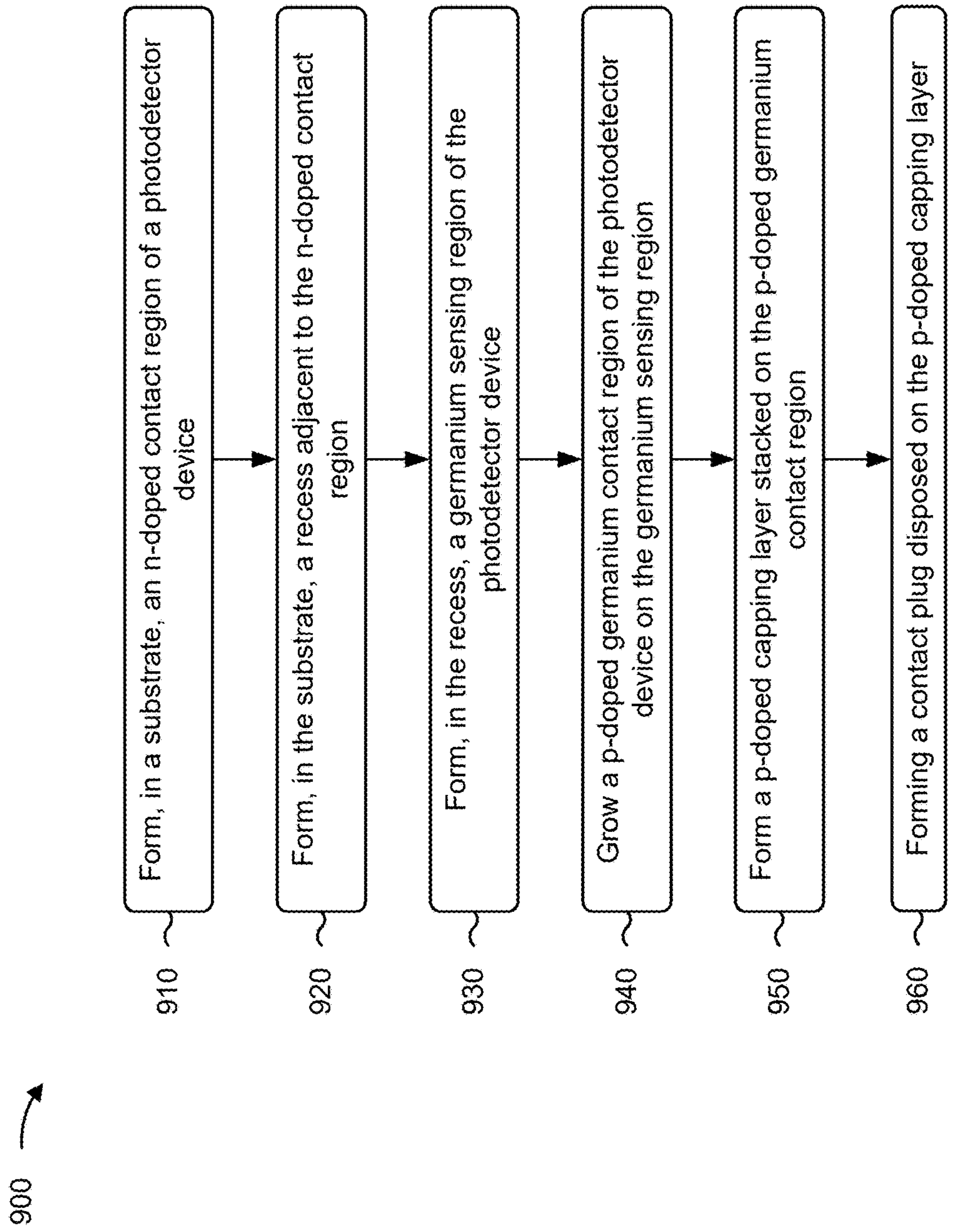
FIG. 9 is a flowchart of an example process associated with forming a photodetector device.

FIG. 9 is a flowchart of an example process 900 associated with forming a photodetector device. In some implementations, one or more process blocks of FIG. 9 are performed by a one or more semiconductor processing tools (e.g., one or more of the semiconductor processing tools 102-116). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming, in a substrate, an n-doped contact region of a photodetector device (block 910). For example, one or more of the semiconductor processing tools 102-116 may form, in a substrate 402, an n-doped contact region (e.g., a contact region 204) of a photodetector device 200, as described herein.

As further shown in FIG. 9, process 900 may include forming, in the substrate, a recess adjacent to the n-doped contact region (block 920). For example, one or more of the semiconductor processing tools 102-116 may form, in the substrate 402, a recess 704 adjacent to the n-doped contact region (e.g., the contact region 204), as described herein.

As further shown in FIG. 9, process 900 may include forming, in the recess, a germanium sensing region of the photodetector device (block 930). For example, one or more of the semiconductor processing tools 102-116 may form, in the recess 704, a germanium sensing region (e.g., a sensing region 206) of the photodetector device 200, as described herein.

As further shown in FIG. 9, process 900 may include growing a p-doped germanium contact region of the photodetector device on the germanium sensing region (block 940). For example, one or more of the semiconductor processing tools 102-116 may grow a p-doped germanium contact region (e.g., the contact region 202) of the photodetector device 200 on the germanium sensing region (e.g., the sensing region 206), as described herein.

As further shown in FIG. 9, process 900 may include forming a p-doped capping layer stacked on the p-doped germanium contact region (block 950). For example, one or more of the semiconductor processing tools 102-116 may form a p-doped capping layer (e.g., a capping layer 412) stacked on the p-doped germanium contact region (e.g., the contact region 202), as described herein.

As further shown in FIG. 9, process 900 may include forming a contact plug disposed on the p-doped capping layer stacked on the p-doped germanium contact region (block 960). For example, one or more of the semiconductor processing tools 102-116 may form contact plug (e.g., a contact 418) disposed on the p-doped capping layer, as described herein.

Process 900 may include additional implementations, such as any single implementation or any combination of implementations described below and/or in connection with one or more other processes described elsewhere herein.

In a first implementation, forming the germanium sensing region includes depositing the germanium sensing region, and planarizing the germanium sensing region after depositing the germanium sensing region. In a second implementation, alone or in combination with the first implementation, planarizing the germanium sensing region includes planarizing the germanium sensing region such that a top surface of the germanium sensing region is lower relative to a top surface of an oxide layer (e.g., a top oxide 406) on the substrate. In a third implementation, alone or in combination with one or more of the first and second implementations, forming the p-doped germanium contact region includes epitaxially growing the p-doped germanium contact region on the germanium sensing region.

In a fourth implementation, alone or in combination with one or more of the first through third implementations, forming the p-doped capping layer includes epitaxially growing the p-doped capping layer on the p-doped germanium contact region. In a fifth implementation, alone or in combination with one or more of the first through fourth implementations, forming the p-doped germanium contact region includes selectively depositing the p-doped germanium contact region on the germanium sensing region. In a sixth implementation, alone or in combination with one or more of the first through fifth implementations, process 900 includes forming a remote plasma oxide layer 602 on the p-doped capping layer.

In a seventh implementation, alone or in combination with one or more of the first through sixth implementations, forming the germanium sensing region includes depositing a first portion of the germanium sensing region, performing a first annealing operation to remove defects from the first portion of the germanium sensing region, depositing a second portion of the germanium sensing region on the first portion of the germanium sensing region after performing the first annealing operation, and performing a second annealing operation to remove defects from the second portion of the germanium sensing region.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

In this way, a photodetector includes a stacked (or vertically arranged) photodetector having at least one contact region on a germanium sensing region as opposed to the at least one contact being adjacent to the germanium sensing region. Including the at least one contact on the germanium sensing region reduces the amount of surface area of the germanium sensing region that is interfaced with a substrate (e.g., a silicon substrate) in which the germanium sensing region is included. This reduces the amount of lattice mismatch reduces the amount of misfit defects for the germanium sensing region, which reduces the dark current for the photodetector. The reduced amount of dark current may increase the photosensitivity of the photodetector, may increase low-light performance of the photodetector, and/or may decrease noise and other defects in images and/or light captured by the photodetector, among other examples.

As described in greater detail above, some implementations described herein provide a photodetector device. The photodetector device includes a sensing region included in a substrate. A lattice size of the sensing region is larger than a lattice size of the substrate. The photodetector device includes a first type doped contact region adjacent to the sensing region. The photodetector device includes a second type doped contact region stacked on the sensing region. The photodetector device includes a contact plug disposed on the second type doped contact region.

As described in greater detail above, some implementations described herein provide a method. The method includes forming, in a substrate, an n-doped contact region of a photodetector device. The method includes forming, in the substrate, a recess adjacent to the n-doped contact region. The method includes forming, in the recess, a germanium sensing region of the photodetector device. The method includes growing a p-doped germanium contact region of the photodetector device on the germanium sensing region. The method includes forming a p-doped capping layer stacked on the p-doped germanium contact region. The method includes forming a contact plug disposed on the p-doped capping layer.

As described in greater detail above, some implementations described herein provide a photodetector device. The photodetector device includes an oxide layer on a substrate. The photodetector device includes a germanium sensing region included in the substrate. The photodetector device includes an n-type contact region in the substrate and adjacent to the germanium sensing region. The photodetector device includes an STI region in the substrate between the n-type contact region and the germanium sensing region. The photodetector device includes a p-type contact region on the sensing region, where a bottom surface of the p-type contact region is below a top surface of the oxide layer, and where a top surface of the p-type contact region is above the top surface of the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photodetector device, comprising:

a sensing region included in a substrate, wherein a lattice size of the sensing region is larger than a lattice size of the substrate;

a first type doped contact region adjacent to the sensing region, wherein only the substrate and an isolation structure separate the first type doped contact region and the sensing region;

a p-doped germanium contact region above and in physical contact with the sensing region;

a contact plug disposed on the p-doped germanium contact region; and a p-doped capping layer on the p-doped germanium contact region.

2. The photodetector device of claim 1, wherein the first type doped contact region comprises: an n-type contact region; and wherein the p-doped germanium contact region comprises: a p-type contact region.

3. The photodetector device of claim 1, further comprising: an extension region in the substrate, wherein the extension region is at least partially between the sensing region and the first type doped contact region, and wherein the extension region is configured to facilitate a flow of electrons from the sensing region to the first type doped contact region.

4. The photodetector device of claim 1, further comprising: a capping layer on the p-doped germanium contact region; and a remote plasma oxide layer on the capping layer.

5. The photodetector device of claim 4, wherein the contact plug is directly above the capping layer.

6. The photodetector device of claim 1, wherein the sensing region comprises: a germanium sensing region.

7. The photodetector device of claim 1, wherein the p-doped capping layer comprises: a p-doped silicon capping layer.

8. A photodetector device, comprising: an oxide layer on a substrate; a germanium sensing region included in the substrate; an n-type contact region in the substrate and next to the germanium sensing region, wherein the n-type contact region is not in physical contact with the germanium sensing region; a shallow trench isolation (STI) region in the substrate between the n-type contact region and the germanium sensing region, wherein only the substrate and the STI region separate the n-type contact region and the germanium sensing region; a p-type contact region above and in physical contact with the germanium sensing region, wherein a bottom surface of the p-type contact region is below a top surface of the oxide layer, and wherein a top surface of the p-type contact region is above the top surface of the oxide layer; and a p-type capping layer on the top surface of the p-type contact region and on a portion of one or more sides of the p-type contact region.

9. The photodetector device of claim 8, further comprising: an n-type extension region in the substrate and below the n-type contact region, wherein a portion of the n-type extension region is below the p-type contact region.

10. The photodetector device of claim 8, wherein a top surface of the germanium sensing region is approximately flat; and wherein the top surface of the germanium sensing region is lower relative to the top surface of the oxide layer.

11. The photodetector device of claim 8, further comprising: a remote plasma oxide layer on the top surface of the p-type capping layer and on at least a portion of one or more sides of the p-type capping layer.

12. The photodetector device of claim 11, wherein the remote plasma oxide layer is included above and over the p-type contact region.

13. A photodetector device, comprising: a sensing region included in a substrate; a first type of doped contact region adjacent to the sensing region and not in physical contact with the sensing region; a p-doped germanium contact region above and in physical contact with the sensing region; and a p-doped capping layer stacked on the p-doped germanium contact region, wherein the p-doped capping layer contacts at least three sides of the p-doped germanium contact region.

14. The photodetector device of claim 13, wherein the sensing region is a germanium sensing region.

15. The photodetector device of claim 13, further comprising: a shallow trench isolation (STI) region in the substrate between the first type of doped contact region and the sensing region.

16. The photodetector device of claim 13, wherein the first type of doped contact region is an n-type contact region and the p-doped germanium contact region is a p-type contact region.

17. The photodetector device of claim 13, further comprising: an oxide layer on the substrate, wherein a bottom surface of the p-doped germanium contact region is below a top surface of the oxide layer, and wherein a top surface of the p-doped germanium contact region is above the top surface of the oxide layer.

18. The photodetector device of claim 13, further comprising: an extension region in the substrate and below the first type of doped contact region, wherein a portion of the extension region is below the p-doped germanium contact region, and wherein the extension region is at least partially between the sensing region and the first type of doped contact region.

19. The photodetector device of claim 13, wherein only the substrate and an isolation structure separate the first type of doped contact region and the sensing region.

* * * * *